(12) United States Patent
Park

(10) Patent No.: US 12,267,962 B2
(45) Date of Patent: Apr. 1, 2025

(54) CAPACITOR-WIRE-EMBEDDED WIRING BOARD

(71) Applicant: Samsung Electronics Co., Ltd., Suwon-si (KR)

(72) Inventor: Soojae Park, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 220 days.

(21) Appl. No.: 17/981,847

(22) Filed: Nov. 7, 2022

(65) Prior Publication Data
US 2023/0319998 A1    Oct. 5, 2023

(30) Foreign Application Priority Data

Mar. 17, 2022   (KR) .................. 10-2022-0033342

(51) Int. Cl.
*H05K 1/16*    (2006.01)
*H01G 4/01*    (2006.01)
(Continued)

(52) U.S. Cl.
CPC .............. *H05K 1/186* (2013.01); *H01G 4/01* (2013.01); *H01G 4/012* (2013.01); *H01G 4/28* (2013.01); *H01G 4/38* (2013.01); *H01L 24/16* (2013.01); *H01L 25/16* (2013.01); *H05K 1/119* (2013.01); *H05K 1/162* (2013.01); *H05K 1/181* (2013.01); *H05K 1/183* (2013.01); *H01G 4/008* (2013.01); *H01G 4/1209* (2013.01); *H01L 23/3128* (2013.01); *H01L 2224/16227* (2013.01);
(Continued)

(58) Field of Classification Search
CPC ................................. H01G 4/28; H05K 1/162
See application file for complete search history.

(56) References Cited

U.S. PATENT DOCUMENTS

| | | |
|---|---|---|
| 5,828,093 A | 10/1998 | Naito et al. |
| 6,891,258 B1 | 5/2005 | Alexander et al. |

(Continued)

FOREIGN PATENT DOCUMENTS

| | | |
|---|---|---|
| JP | 2007-184554 A | 7/2007 |
| JP | 2009-064966 A | 3/2009 |

OTHER PUBLICATIONS

Examination Report dated Aug. 26, 2024 received from the Korean Patent Office for corresponding application No. KR 1020220033342.

*Primary Examiner* — Jeremy C Norris
(74) *Attorney, Agent, or Firm* — Muir Patent Law, PLLC

(57) ABSTRACT

A wiring board includes an insulating layer having a first surface and a second surface, which are opposite to each other, upper wiring patterns on the first surface of the insulating layer, lower wiring patterns on the second surface of the insulating layer, intermediate wiring patterns, which are disposed in the insulating layer and are electrically connected to the upper wiring patterns and the lower wiring patterns, and a capacitor wire connected to corresponding wiring patterns of the upper wiring patterns, the lower wiring patterns, and the intermediate wiring patterns. The capacitor wire includes a core electrode line having a wire shape, an outer electrode line covering at least a portion of the core electrode line, and a dielectric line interposed between the core electrode line and the outer electrode line.

20 Claims, 26 Drawing Sheets

(51) Int. Cl.
*H01G 4/012* (2006.01)
*H01G 4/28* (2006.01)
*H01G 4/38* (2006.01)
*H01L 23/00* (2006.01)
*H01L 25/16* (2023.01)
*H05K 1/11* (2006.01)
*H05K 1/18* (2006.01)
*H01G 4/008* (2006.01)
*H01G 4/12* (2006.01)
*H01L 23/31* (2006.01)

(52) U.S. Cl.
CPC ............... *H01L 2924/19041* (2013.01); *H01L 2924/19105* (2013.01); *H01L 2924/19107* (2013.01); *H05K 2201/09036* (2013.01); *H05K 2201/09472* (2013.01); *H05K 2201/10015* (2013.01); *H05K 2201/10378* (2013.01); *H05K 2201/10545* (2013.01); *H05K 2201/10583* (2013.01)

(56) References Cited

U.S. PATENT DOCUMENTS

| | | | |
|---|---|---|---|
| 7,532,453 | B2 | 5/2009 | Yamamoto et al. |
| 7,656,013 | B2 | 2/2010 | Horiuchi et al. |
| 7,906,803 | B2 | 3/2011 | Shioya et al. |
| 8,988,857 | B2 | 3/2015 | McConnell et al. |
| 9,048,026 | B2 | 6/2015 | Ahn et al. |
| 9,686,862 | B2 | 6/2017 | Daghighian |
| 9,929,722 | B1 | 3/2018 | Friend et al. |
| 10,290,412 | B2 | 5/2019 | Wolter et al. |
| 10,756,161 | B2 | 8/2020 | Balasubramanian et al. |
| 2003/0085471 | A1* | 5/2003 | Iijima ............ H01L 23/642 257/774 |
| 2009/0277673 | A1 | 11/2009 | Sohn et al. |
| 2010/0071944 | A1 | 3/2010 | Endo |
| 2012/0017435 | A1 | 1/2012 | Sohn et al. |
| 2015/0221592 | A1 | 8/2015 | Verma et al. |

\* cited by examiner

CAPACITOR-WIRE-EMBEDDED WIRING BOARD

CROSS-REFERENCE TO RELATED APPLICATIONS

This U.S. non-provisional patent application claims priority under 35 U.S.C. § 119 to Korean Patent Application No. 10-2022-0033342, filed on Mar. 17, 2022, in the Korean Intellectual Property Office, the entire contents of which are hereby incorporated by reference.

BACKGROUND OF THE INVENTION

The present disclosure relates to a capacitor-wire-embedded wiring board.

To realize a high-performance electronic device with several functions, a plurality of active and passive components are mounted on a surface of a wiring board. The passive components are used for effective signal exchange between the active components and may include resistors, inductors, capacitors, and so forth. To mount the passive components in a high density, many studies are being conducted to develop an embedded-type wiring board, in which the passive components are embedded.

SUMMARY

An embodiment of the inventive concept provides an embedded-type wiring board whose size and thickness can be easily reduced.

An embodiment of the inventive concept provides an embedded-type wiring board with high performance and improved reliability.

According to an embodiment of the inventive concept, a wiring board may include an insulating layer having a first surface and a second surface, which are opposite to each other, upper wiring patterns on the first surface of the insulating layer, lower wiring patterns on the second surface of the insulating layer, intermediate wiring patterns, which are disposed in the insulating layer and are electrically connected to the upper wiring patterns and the lower wiring patterns, and a capacitor wire connected to corresponding wiring patterns of the upper wiring patterns, the lower wiring patterns, and the intermediate wiring patterns. The capacitor wire may include a core electrode line having a wire shape, an outer electrode line covering at least a portion of the core electrode line, and a dielectric line interposed between the core electrode line and the outer electrode line.

According to an embodiment of the inventive concept, a wiring board may include an insulating layer having a first surface and a second surface, which are opposite to each other, upper wiring patterns on the first surface of the insulating layer, lower wiring patterns on the second surface of the insulating layer, intermediate wiring patterns, which are disposed in the insulating layer and are electrically connected to the upper wiring patterns and the lower wiring patterns, and a capacitor chip, which is disposed in the insulating layer and is electrically connected to corresponding ones of the intermediate wiring patterns. The capacitor chip may include a substrate having a top surface and a bottom surface, which are opposite to each other, and a plurality of capacitor wires mounted on the top surface of the substrate. The capacitor chip may be electrically connected to the corresponding intermediate wiring patterns through the substrate. Each of the capacitor wires may include a core electrode line having a wire shape, an outer electrode line covering at least a portion of the core electrode line, and a dielectric line interposed between the core electrode line and the outer electrode line.

According to an embodiment of the inventive concept, a wiring board may include an insulating layer having a first surface and a second surface, which are opposite to each other, upper wiring patterns on the first surface of the insulating layer, lower wiring patterns on the second surface of the insulating layer, intermediate wiring patterns, which are disposed in the insulating layer and are electrically connected to the upper wiring patterns and the lower wiring patterns, and a capacitor wire connected to corresponding wiring patterns of the upper wiring patterns, the lower wiring patterns, and the intermediate wiring patterns. The capacitor wire may include a core electrode line, which has a wire shape and is extended in a longitudinal direction, a dielectric line, which is provided to enclose an outer circumference surface of the core electrode line and is extended in the longitudinal direction, and an outer electrode line, which is provided to enclose an outer circumference surface of the dielectric line and is extended in the longitudinal direction. The capacitor wire may be connected to the corresponding wiring patterns by a wire bonding method.

DETAILED DESCRIPTION

Example embodiments of the inventive concepts will now be described more fully with reference to the accompanying drawings, in which example embodiments are shown.

Figure 1:
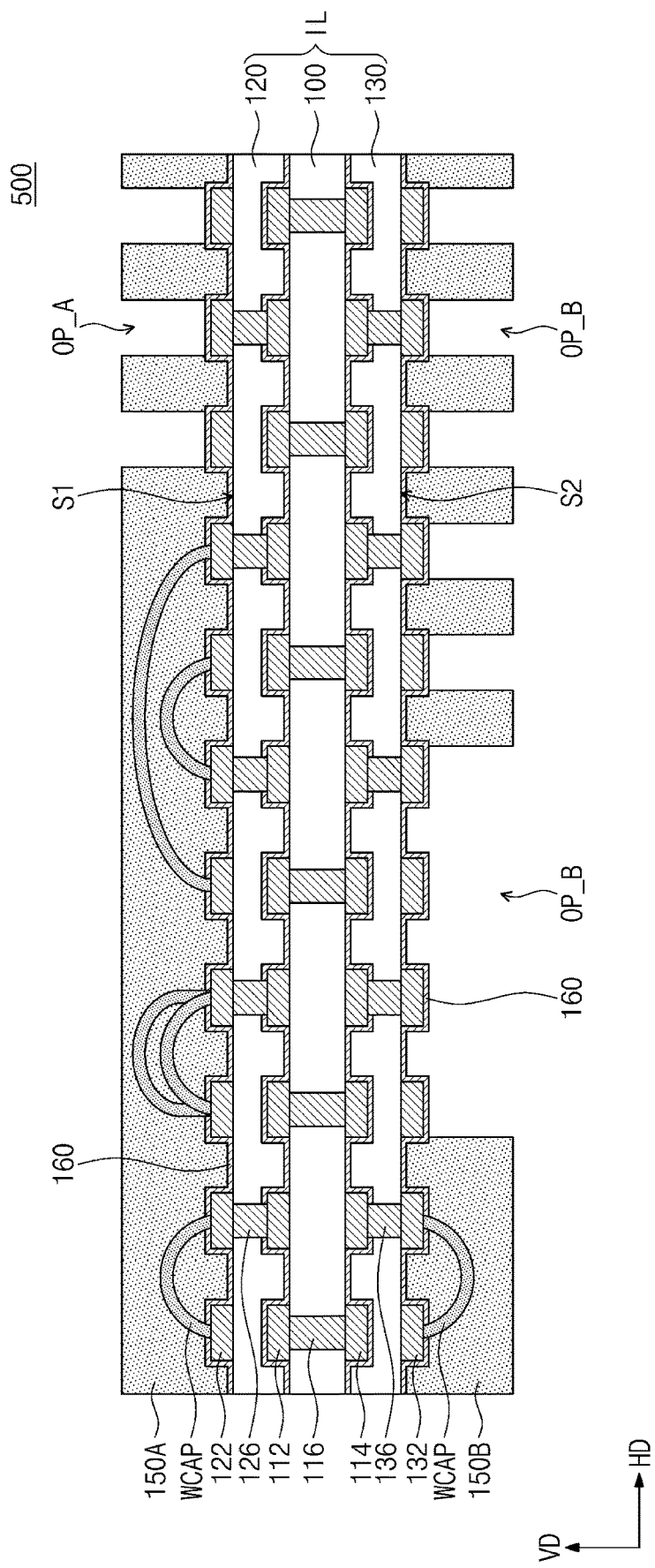
FIG. 1 is a sectional view illustrating a wiring board according to an embodiment of the inventive concept.

FIG. 1 is a sectional view illustrating a wiring board according to an embodiment of the inventive concept. FIG.

Figure 2:
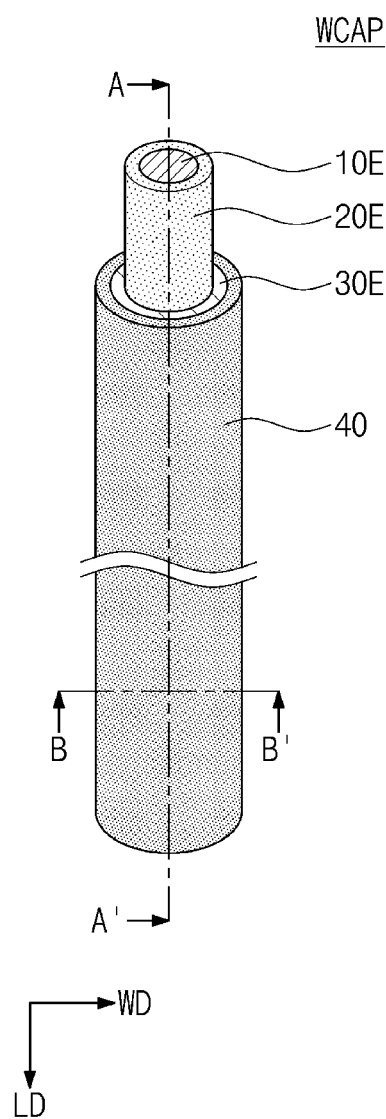
FIG. 2 is a perspective view schematically illustrating a capacitor wire of FIG. 1.
Figure 3A:
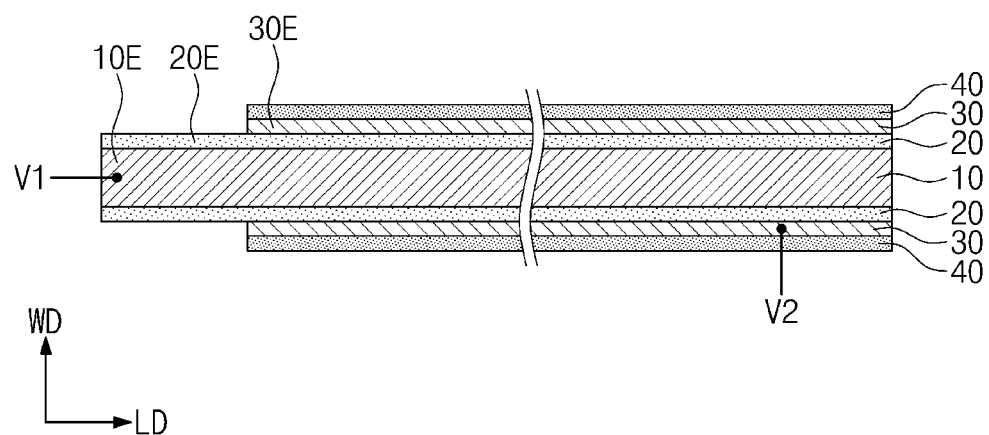
FIG. 3A is a sectional view taken along a line A-A' of FIG. 2.
Figure 3B:
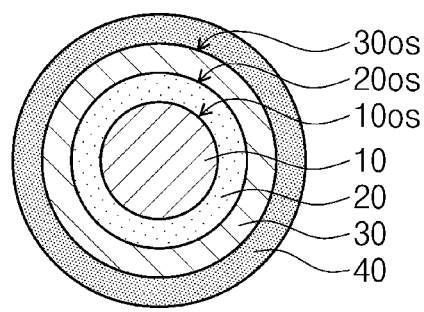
FIG. 3B is a sectional view taken along a line B-B' of FIG. 2.
Figure 4:
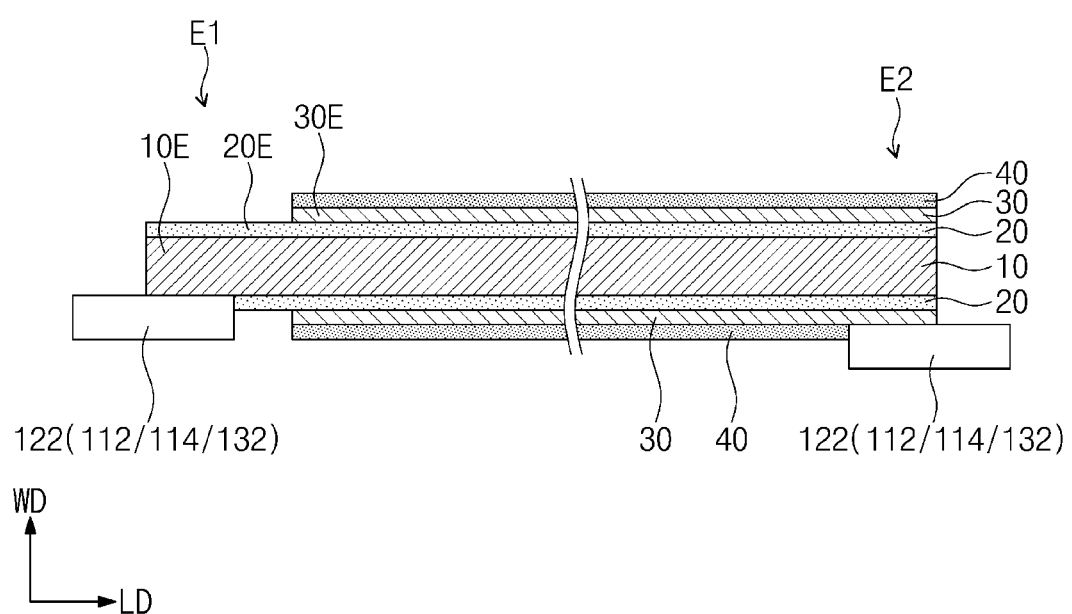
FIG. 4 is a conceptual diagram illustrating an example method of bonding the capacitor wire of FIG. 2.

2 is a schematic perspective view illustrating a capacitor wire of FIG. 1, FIG. 3A is a sectional view taken along a line A-A' of FIG. 2, and FIG. 3B is a sectional view taken along a line B-B' of FIG. 2. FIG. 4 is a conceptual diagram illustrating an example method of bonding the capacitor wire of FIG. 2.

Referring to FIG. 1, a wiring board 500 may include an insulating layer IL having a first surface S1 and a second surface S2, which are opposite to each other, upper wiring patterns 122 on the first surface S1 of the insulating layer IL, lower wiring patterns 132 on the second surface S2 of the insulating layer IL, and intermediate wiring patterns 112 and 114, which are disposed in the insulating layer IL and are electrically connected to the upper and lower wiring patterns 122 and 132.

The insulating layer IL may include an upper insulating layer 120 adjacent to the first surface S1, a lower insulating layer 130 adjacent to the second surface S2, and an intermediate layer 100 between the upper and lower insulating layers 120 and 130. Each of the upper and lower insulating layers 120 and 130 may be formed of or include an insulating polymer material and may further include glass fiber. In an embodiment, the intermediate layer 100 may include a core substrate. The core substrate may be formed of or include an insulating polymer material and may further include glass fiber. Alternatively, the core substrate may be formed of or include a metallic material (e.g., copper and aluminum). In an embodiment, the intermediate layer 100 may include a plurality of intermediate insulating layers, which are provided between the upper insulating layer 120 and the lower insulating layer 130 and are stacked in a vertical direction VD perpendicular to the first surface S1, and the core substrate, which is interposed between the intermediate insulating layers. In this case, each of the intermediate insulating layers may be formed of or include an insulating polymer material and may further include glass fiber.

The upper wiring patterns 122 may be disposed on the first surface S1 of the insulating layer IL and on the upper insulating layer 120. The upper wiring patterns 122 may be formed of or include at least one of metallic materials (e.g., copper). The lower wiring patterns 132 may be disposed on the second surface S2 of the insulating layer IL and on the lower insulating layer 130. The lower wiring patterns 132 may be formed of or include at least one of metallic materials (e.g., copper). The intermediate wiring patterns 112 and 114 may include first intermediate wiring patterns 112, which are disposed between the intermediate layer 100 and the upper insulating layer 120, and second intermediate wiring patterns 114, which are disposed between the intermediate layer 100 and the lower insulating layer 130. The intermediate wiring patterns 112 and 114 may be formed of or include at least one of metallic materials (e.g., copper).

The wiring board 500 may further include upper vias 126, which are disposed in the upper insulating layer 120 to electrically connect the upper wiring patterns 122 to the first intermediate wiring patterns 112, lower vias 136, which are disposed in the lower insulating layer 130 to electrically connect the lower wiring patterns 132 to the second intermediate wiring patterns 114, and intermediate vias 116, which are disposed in the intermediate layer 100 to electrically connect the first intermediate wiring patterns 112 to the second intermediate wiring patterns 114. The wiring board 500 may further include additional intermediate wiring patterns, which are disposed in the intermediate layer 100, and additional intermediate vias, which are provided to electrically connect the additional intermediate wiring patterns to each other. The upper vias 126, the lower vias 136, and the intermediate vias 116 may be formed of or include at least one of metallic materials (e.g., copper).

The wiring board 500 may include a capacitor wire WCAP, which is electrically connected to corresponding ones of the upper wiring patterns 122, the lower wiring patterns 132, and the intermediate wiring patterns 112 and 114. The capacitor wire WCAP may be connected to the corresponding wiring patterns 122, 132, 112, and 114 by a wire bonding method.

Referring to FIGS. 2, 3A, and 3B, the capacitor wire WCAP may include a core electrode line 10, an outer electrode line 30 covering at least a portion of the core electrode line 10, a dielectric line 20 interposed between the core electrode line 10 and the outer electrode line 30, and a passivation line 40 covering at least a portion of the outer electrode line 30.

The core electrode line 10 may have a wire shape and may be elongated in a specific direction. The specific direction may be referred to as a longitudinal direction LD of the core electrode line 10, and a direction perpendicular to the longitudinal direction LD may be referred to as a width direction WD. In an embodiment, as shown in FIG. 3B, the core electrode line 10 may have a rounded shape or cylindrical (e.g., a circular shape), when viewed in a sectional view taken in the width direction WD. In another embodiment, unlike that illustrated in the drawings, the core electrode line 10 may have a polygonal shape (e.g., a rectangular shape), when viewed in a sectional view taken in the width direction WD. The core electrode line 10 may include a first metal, and the first metal may include at least one of, for example, Au, Ag, Pd, Cu, and Al.

The dielectric line 20 may cover at least a portion of the core electrode line 10 and may be extended in the longitudinal direction LD between the core electrode line 10 and the outer electrode line 30. The dielectric line 20 may enclose an outer circumference surface 10os of the core electrode line 10 and may be extended along the outer circumference surface 10os of the core electrode line 10 or in the longitudinal direction LD. The dielectric line 20 may be formed of or include at least one of ceramic materials (e.g., $Al_2O_3$). An inner surface of the dielectric line 20 may contact the outer circumferential surface 10os of the core electrode line 10, an inner surface of the outer electrode line 30 may contact an outer circumferential surface 20os of the dielectric line 20, and an inner surface of the passivation line 40 may contact an outer circumferential surface 30os of the outer electrode line 30. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The outer electrode line 30 may cover at least a portion of the dielectric line 20 and may be extended in the longitudinal direction LD between the dielectric line 20 and the passivation line 40. The outer electrode line 30 may enclose an outer circumference surface 20os of the dielectric line 20 and may be extended along the outer circumference surface 20os of the dielectric line 20 or in the longitudinal direction LD. The outer electrode line 30 may be electrically disconnected or isolated from the core electrode line 10 by the dielectric line 20. The length of the outer electrode line 30 may be less than the length of the core electrode line 10 and the dielectric line 20 in the longitudinal direction LD. The length of the dielectric line 20 may be substantially the same as the length of the core electrode line 10.

The outer electrode line 30 may be formed of at least one of metal materials including a metal or metal alloys) (i.e., "first metal") having melting points lower than the core electrode line 10. In addition, the first metal may have a mechanical strength smaller than the core electrode line 10. As an example, the outer electrode line 30 may include a second metal, which is different from the first metal, or an alloy of the second metal. In an embodiment, the outer electrode line 30 may be formed of or include at least one of arsenic-copper alloys, aluminum-cerium alloys, aluminum-scandium alloys, silver-germanium alloys, silver-palladium alloys, aluminum-indium alloys, field's metals, arsenic-antimony alloys, aluminum-magnesium alloys, magnesium-praseodymium alloys, arsenic-tin alloys, aluminum-silicon alloys, gold-magnesium alloys, aluminum-gold alloys, silver-aluminum alloys, gold-lanthanum alloys, aluminum-copper alloys, silver-calcium alloys, aluminum-calcium alloys, silver-arsenic alloys, silver-cerium alloys, gold-cerium alloys, silver-lanthanum alloys, magnesium-nickel alloys, gold-cadmium alloys, silver-antimony alloys, silver-magnesium alloys, silver-strontium alloys, Babbitt metals, aluminum-germanium alloys, magnesium-strontium alloys, gold-tellurium alloys, aluminum-zinc alloys, gold-silicon alloys, gold-antimony alloys, gold-germanium alloys, silver-tellurium alloys, magnesium-zinc alloys, or silver-lead alloys.

The passivation line 40 may cover at least a portion of the outer electrode line 30 and may be extended in the longitudinal direction LD, on the outer electrode line 30. The passivation line 40 may enclose an outer circumference surface 30os of the outer electrode line 30 and may be extended along the outer circumference surface 30os of the outer electrode line 30 and in the longitudinal direction LD. The outer electrode line 30 may be interposed between the dielectric line 20 and the passivation line 40. The passivation line 40 may be formed of or include at least one of insulating or ceramic materials (e.g., $Al_2O_3$) or metallic materials (e.g. Au, Ni, and Pd). The length of the passivation line 40 may be less than the length of the core electrode line 10 and the dielectric line 20 in the longitudinal direction LD. The length of the passivation line 40 may be substantially the same as the length of the outer electrode line 30.

An end portion 10E of the core electrode line 10 may be enclosed by an end portion 20E of the dielectric line 20. The end portion 20E of the dielectric line 20 may not be covered with the outer electrode line 30 and the passivation line 40 and may be exposed. An end portion 30E of the outer electrode line 30 may be adjacent to the end portion 20E of the dielectric line 20 and may be covered with the passivation line 40.

A first voltage V1 may be applied to the core electrode line 10 through the end portion 10E of the core electrode line 10, and a second voltage V2 may be applied to the outer electrode line 30. The first and second voltages V1 and V2 may be different from each other. As an example, one of the first and second voltages V1 and V2 may be a power voltage, and the other of the first and second voltages V1 and V2 may be a ground voltage. Since the core electrode line 10 and the outer electrode line 30 are applied with different voltages, electric charges may be accumulated in the dielectric line 20. Accordingly, the wire-shaped capacitor wire WCAP may be used as a capacitor.

Referring to FIGS. 1 and 4, the capacitor wire WCAP may be connected to the corresponding wiring patterns 122, 132, 112, and 114 by a wire bonding method. The capacitor wire WCAP may have a first end portion E1 and a second end portion E2, which are opposite to each other in the longitudinal direction LD. At the first end portion E1 of the capacitor wire WCAP, the end portion 10E of the core electrode line 10 may be connected to one of the corresponding wiring patterns 122, 132, 112, and 114 by a ball bonding method or a wedge bonding method. The first end portion E1 of the capacitor wire WCAP may include the end portion 30E of the outer electrode line 30, and the second end portion E2 of the capacitor wire WCAP may include an opposite end portion of the outer electrode line 30. At the second end portion E2 of the capacitor wire WCAP, the opposite end portion of the outer electrode line 30 may be connected to another of the corresponding wiring patterns 122, 132, 112, and 114 by a wedge bonding method.

As an example, the capacitor wire WCAP may be disposed on the first surface S1 of the insulating layer IL and may be connected to corresponding ones of the upper wiring patterns 122. At the first end portion E1 of the capacitor wire WCAP, the core electrode line 10 may be connected to one of the corresponding upper wiring patterns 122 by a ball bonding method or a wedge bonding method, and at the second end portion E2 of the capacitor wire WCAP, the outer electrode line 30 may be connected to another of the corresponding upper wiring patterns 122 by a wedge bonding method. As another example, the capacitor wire WCAP may be disposed on the second surface S2 of the insulating layer IL and may be connected to corresponding ones of the lower wiring patterns 132. At the first end portion E1 of the capacitor wire WCAP, the core electrode line 10 may be connected to one of the corresponding lower wiring patterns 132 by a ball bonding method or a wedge bonding method, and at the second end portion E2 of the capacitor wire WCAP, the outer electrode line 30 may be connected to another of the corresponding lower wiring patterns 132 by a wedge bonding method.

Referring back to FIG. 1, the wiring board 500 may further include an upper mask layer 150A, which is disposed on the first surface S1 of the insulating layer IL to cover the upper wiring patterns 122, and a lower mask layer 150B, which is disposed on the second surface S2 of the insulating layer IL to cover the lower wiring patterns 132. Each of the upper and lower mask layers 150A and 150B may be a solder mask or a solder resist and may be formed of or include an insulating material. The capacitor wire WCAP connected to the corresponding upper wiring patterns 122 may be disposed in the upper mask layer 150A, and the capacitor wire WCAP connected to the corresponding lower wiring patterns 132 may be disposed in the lower mask layer 150B.

The wiring board 500 may further include a protection layer 160 covering surfaces of the upper wiring patterns 122, the lower wiring patterns 132, and the intermediate wiring patterns 112 and 114. The protection layer 160 may be formed of or include at least one of metal oxide materials (e.g., aluminum oxide) and may prevent the surfaces of the upper wiring patterns 122, the lower wiring patterns 132, and the intermediate wiring patterns 112 and 114 from being oxidized.

The protection layer 160 covering the surfaces of the first intermediate wiring patterns 112 may be interposed between the first intermediate wiring patterns 112 and the upper insulating layer 120 and may be extended into a region between the intermediate layer 100 and the upper insulating layer 120. The protection layer 160 covering the surfaces of the second intermediate wiring patterns 114 may be interposed between the second intermediate wiring patterns 114 and the lower insulating layer 130 and may be extended into a region between the intermediate layer 100 and the lower insulating layer 130.

The protection layer 160 covering the surfaces of the upper wiring patterns 122 may be interposed between the upper wiring patterns 122 and the upper mask layer 150A and may be extended into a region between the upper insulating layer 120 and the upper mask layer 150A. The capacitor wire WCAP may be provided to penetrate the protection layer 160 and may be connected to the corresponding upper wiring patterns 122. The protection layer 160 covering the surfaces of the lower wiring patterns 132 may be interposed between the lower wiring patterns 132 and the lower mask layer 150B and may be extended into a region between the lower insulating layer 130 and the lower mask layer 150B. The capacitor wire WCAP may be provided to penetrate the protection layer 160 and may be connected to the corresponding lower wiring patterns 132. In an embodiment, the protection layer 160 may be omitted.

The upper mask layer 150A may include upper openings OP_A. The upper openings OP_A may be vertically overlapped (e.g., in the vertical direction VD) with corresponding ones of the upper wiring patterns 122 and may expose the protection layer 160 on the corresponding upper wiring patterns 122. The lower mask layer 150B may include lower openings OP_B. The lower openings OP_B may be vertically overlapped (e.g., in the vertical direction VD) with corresponding ones of the lower wiring patterns 132 and may expose the protection layer 160 on the corresponding lower wiring patterns 132. In an embodiment, the protection layer 160 may be omitted, and in this case, the upper openings OP_A and the lower openings OP_B may expose the corresponding upper wiring patterns 122 and the corresponding lower wiring patterns 132, respectively.

According to an embodiment of the inventive concept, the wiring board 500 may be an embedded-type wiring board, in which the capacitor wire WCAP is embedded, and may be an embedded-type printed circuit board. The capacitor wire WCAP may have a wire shape and may be connected to corresponding ones 122, 132, 112, and 114 of the upper wiring patterns 122, the lower wiring patterns 132, and the intermediate wiring patterns 112 and 114 in the wiring board 500 by a wire bonding method. Since the capacitor wire WCAP has the wire shape, it may be possible to easily reduce a size of the capacitor wire WCAP. Furthermore, since the capacitor wire WCAP is connected to the corresponding wiring patterns 122, 132, 112, and 114 by a wire bonding method, it may be possible to easily mount the capacitor wire WCAP in the wiring board 500. Accordingly, it may be possible to easily increase an integration density of the capacitor wire WCAP, which is embedded in the wiring board 500. As a result, it may be possible not only to easily reduce a size and thickness of the wiring board 500 but also to improve performance and reliability characteristics of the wiring board 500.

FIGS. 5 to 12 are conceptual diagrams exemplarily illustrating some methods of mounting the capacitor wire WCAP of FIG. 1 on the wiring board 500 of FIG. 1.

Referring to FIGS. 5 to 8, the capacitor wire WCAP may be connected to the corresponding wiring patterns 122, 132, 112, and 114 by a wire bonding method. The capacitor wire WCAP may have a first end portion E1 and a second end portion E2, which are opposite to each other in a longitudinal or extension direction of the capacitor wire WCAP. The first and second end portions E1 and E2 of the capacitor wire WCAP may be connected to the corresponding wiring patterns 122, 132, 112, and 114 by a ball bonding method or a wedge bonding method, as described with reference to FIG. 4. The capacitor wire WCAP, which is connected to the corresponding wiring patterns 122, 132, 112, and 114, may have an arch shape.

Figure 5:
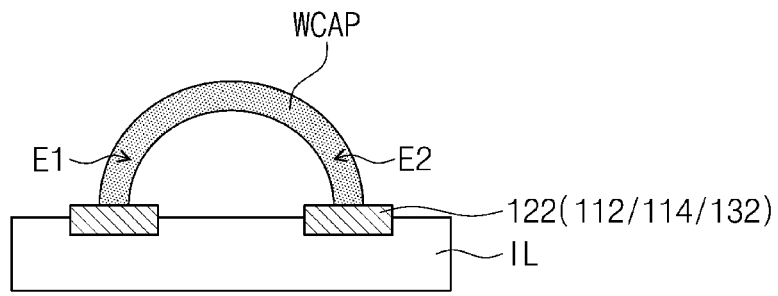
FIGS. 5 to 12 are conceptual diagrams exemplarily illustrating some methods of mounting capacitor wires on the wiring board of FIG. 1.
Figure 6:
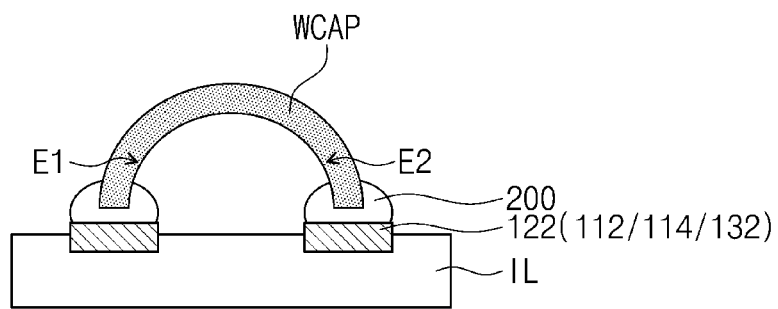
Figure 7:
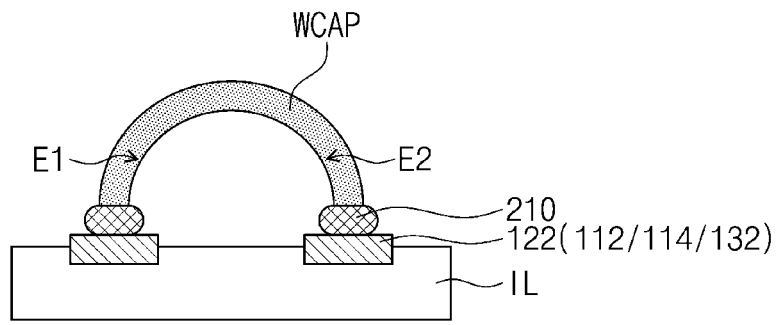
Figure 8:
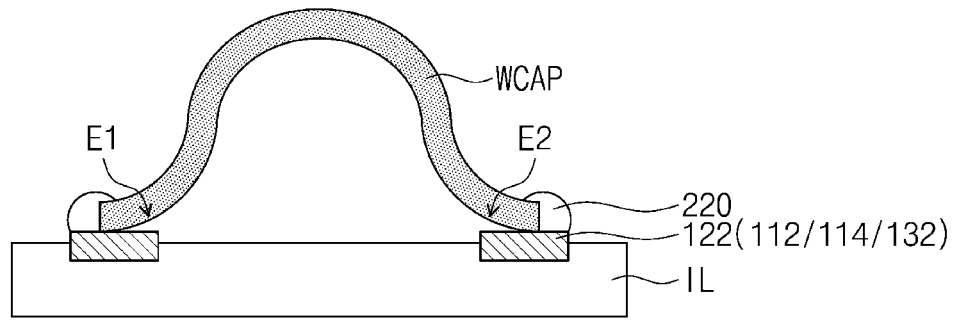

In an embodiment, as shown in FIG. 5, the first and second end portions E1 and E2 of the capacitor wire WCAP may be in contact with the corresponding wiring patterns 122, 132, 112, and 114. In another embodiment, as shown in FIG. 6, a solder ball 200 may be interposed between each of the first and second end portions E1 and E2 of the capacitor wire WCAP and the corresponding wiring pattern 122, 132, 112, or 114. The solder ball 200 may be formed of or include at least one of conductive materials (e.g., metallic materials). A portion of each of the first and second end portions E1 and E2 of the capacitor wire WCAP may be inserted into the solder ball 200. In still another embodiment, as shown in FIG. 7, a conductive bump 210 may be interposed between each of the first and second end portions E1 and E2 of the capacitor wire WCAP and the corresponding wiring pattern 122, 132, 112, or 114. The conductive bump 210 may be formed of or include at least one of conductive materials (e.g., metallic materials). In yet another embodiment, as shown in FIG. 8, the first and second end portions E1 and E2 of the capacitor wire WCAP may be in contact with the corresponding wiring patterns 122, 132, 112, and 114, and reinforcing patterns 220 may be disposed on the corresponding wiring patterns 122, 132, 112, and 114, respectively. The reinforcing patterns 220 may be provided to cover the first and second end portions E1 and E2, respectively, of the capacitor wire WCAP. The reinforcing patterns 220 may be formed of or include at least one of conductive materials (e.g., metallic materials).

Figure 9:
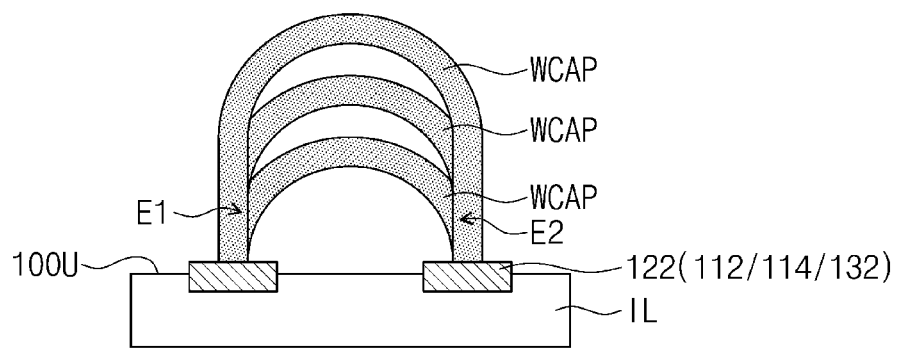
Figure 10:
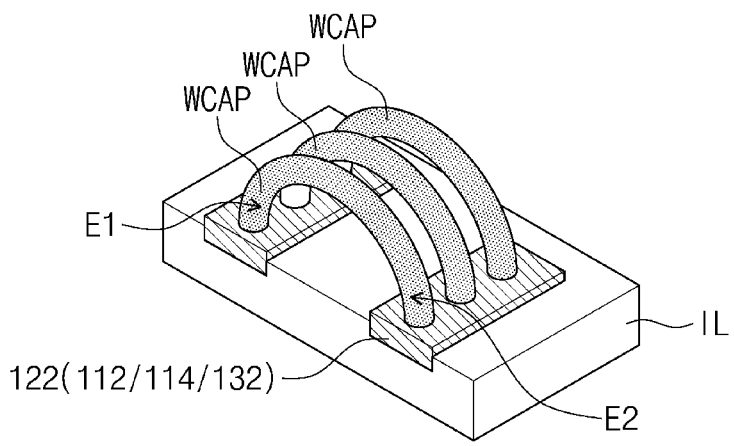
Figure 11:
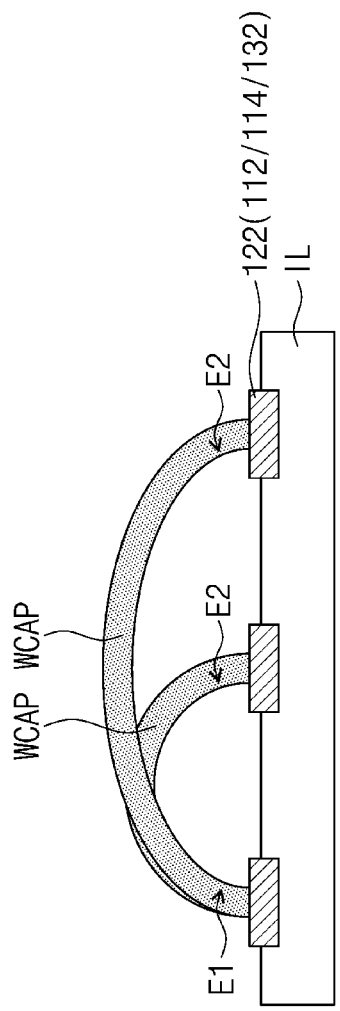

Referring to FIGS. 9 to 11, a plurality of capacitor wires WCAP may be connected to the corresponding wiring patterns 122, 132, 112, and 114 by a wire bonding method. Each of the capacitor wires WCAP, which are connected to the corresponding wiring patterns 122, 132, 112, and 114, may have an arch shape.

In an embodiment, as shown in FIG. 9, the first end portions E1 of the plurality of capacitor wires WCAP may be connected in common to one of the corresponding wiring patterns 122, 132, 112, and 114, and the second end portions E2 of the plurality of capacitor wires WCAP may be connected in common to another of the corresponding wiring patterns 122, 132, 112, and 114. The capacitor wires WCAP may have different lengths from each other and may be stacked in the vertical direction VD to be mounted on the corresponding wiring patterns 122, 132, 112, and 114.

In another embodiment, as shown in FIG. 10, the first end portions E1 of the plurality of capacitor wires WCAP may be connected in common to one of the corresponding wiring patterns 122, 132, 112, and 114, and the second end portions E2 of the plurality of capacitor wires WCAP may be connected in common to another of the corresponding wiring patterns 122, 132, 112, and 114. The capacitor wires WCAP may have substantially the same length and may be mounted on the corresponding wiring patterns 122, 132, 112, and 114 to be spaced apart from each other in a horizontal direction HD that is parallel to the first surface S1 of the insulating layer IL of FIG. 1. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

In still another embodiment, as shown in FIG. 11, the first end portions E1 of the plurality of capacitor wires WCAP may be connected in common to one of the corresponding wiring patterns 122, 132, 112, and 114, and the second end portions E2 of the plurality of capacitor wires WCAP may be respectively connected to different ones of the corresponding wiring patterns 122, 132, 112, and 114. In this case, a ground voltage may be applied in common to the plurality of capacitor wires WCAP, and different power voltages may be applied to the plurality of capacitor wires WCAP, respectively.

Figure 12:
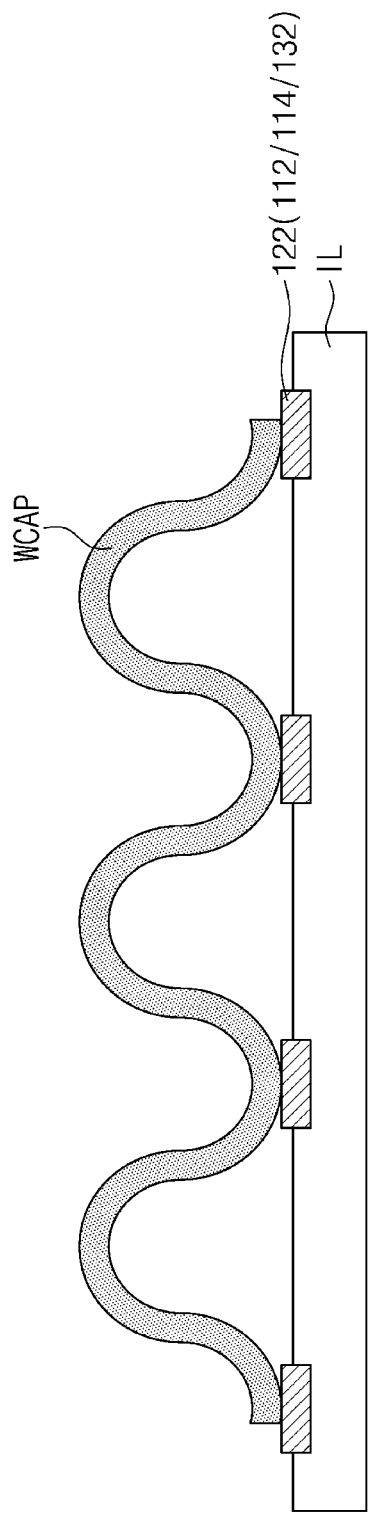

Referring to FIG. 12, the capacitor wire WCAP may be connected to the corresponding wiring patterns 122, 132, 112, and 114 by a stitch bonding method. In this case, the capacitor wire WCAP may include outer electrode segments, which are spaced apart from each other in an extension direction (or the longitudinal direction LD) of the capacitor wire WCAP. The outer electrode segments of the capacitor wire WCAP may be connected to the corresponding wiring patterns 122, 132, 112, and 114, respectively, by a stitch bonding method. The capacitor wire WCAP, which is connected to the corresponding wiring patterns 122, 132, 112, and 114, may include a plurality of arch-shaped portions.

Figure 13:
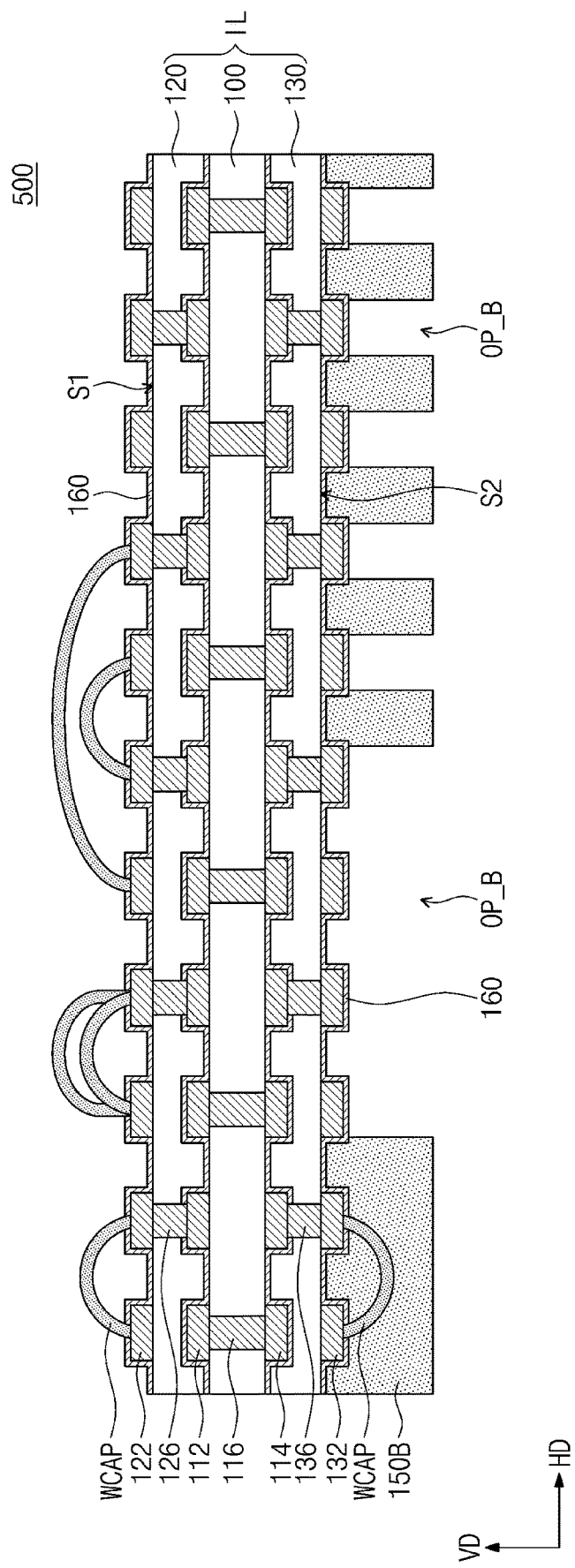
FIGS. 13 to 18 are sectional views, each of which illustrates a wiring board, according to an embodiment of the inventive concept.

FIG. 13 is a sectional view illustrating a wiring board according to an embodiment of the inventive concept. For the sake of brevity, features, which are different from the wiring board described with reference to FIGS. 1 to 4, will be mainly described below.

Referring to FIG. 13, the wiring board 500 may not include the upper mask layer 150A. Thus, the capacitor wire WCAP, which is connected to the corresponding upper wiring patterns 122, and the protection layer 160, which is provided on the upper wiring patterns 122, may be exposed. In an embodiment, the protection layer 160 may be omitted, and in this case, the upper wiring patterns 122 may be exposed.

Figure 14:
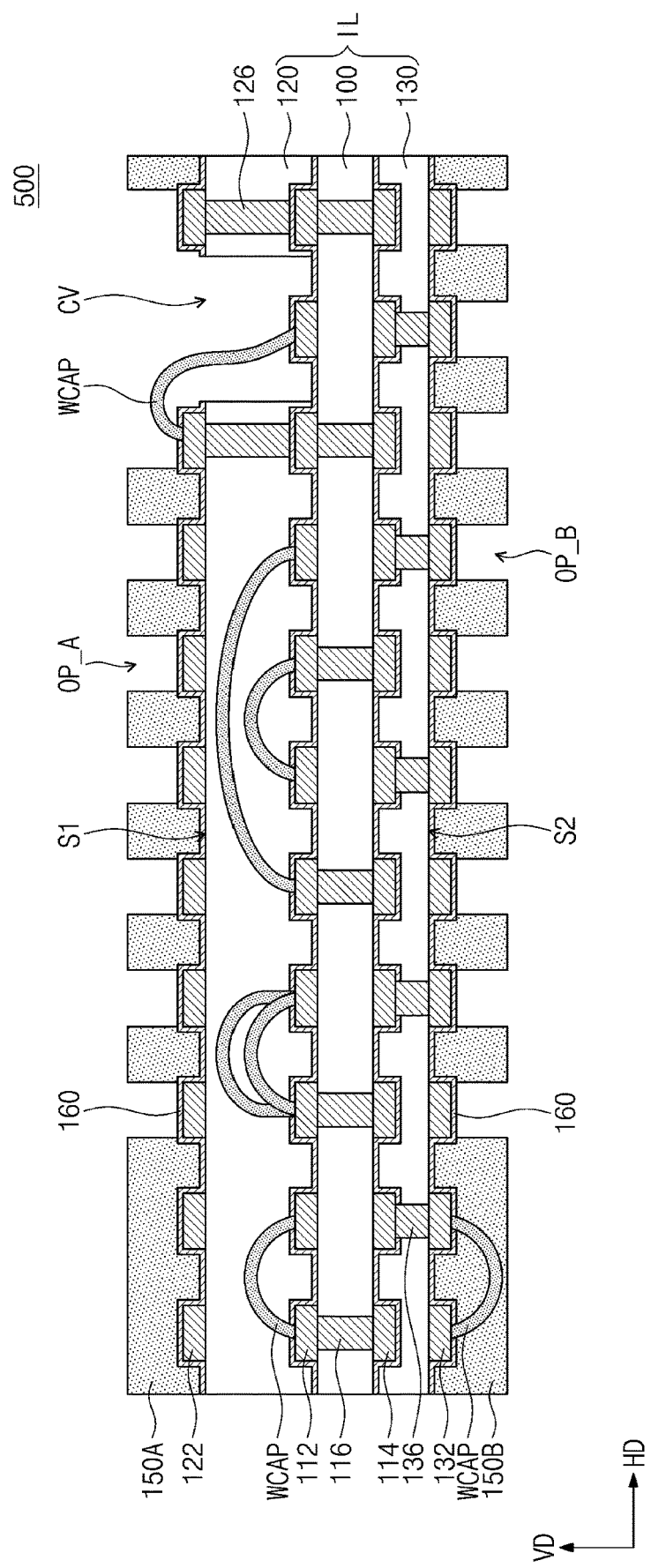

FIG. 14 is a sectional view illustrating a wiring board according to an embodiment of the inventive concept. For the sake of brevity, features, which are different from the wiring board described with reference to FIGS. 1 to 4, will be mainly described below.

In some embodiments, as shown FIG. 14, the capacitor wire WCAP may be disposed in the insulating layer IL and may be connected to corresponding ones of the intermediate wiring patterns 112 and 114. As an example, the capacitor wire WCAP may be disposed in the upper insulating layer 120 and may be connected to corresponding ones of the first intermediate wiring patterns 112. As shown in FIG. 4, at the first end portion E1 of the capacitor wire WCAP, the core electrode line 10 may be connected to one of the corresponding intermediate wiring patterns 112 and 114 by a ball bonding method or a wedge bonding method, and at the second end portion E2 of the capacitor wire WCAP, the outer electrode line 30 may be connected to another of the corresponding intermediate wiring patterns 112 and 114 by a wedge bonding method.

In an embodiment, the insulating layer IL may include a cavity CV, which is formed to penetrate the same, and the capacitor wire WCAP may be disposed in the cavity CV. As an example, the upper insulating layer 120 may include the cavity CV, which is formed to penetrate the same, and the capacitor wire WCAP may be disposed in the cavity CV. The capacitor wire WCAP may be connected to one of the upper wiring patterns 122 and one of the first intermediate wiring patterns 112 by a wire bonding method.

Figure 15:
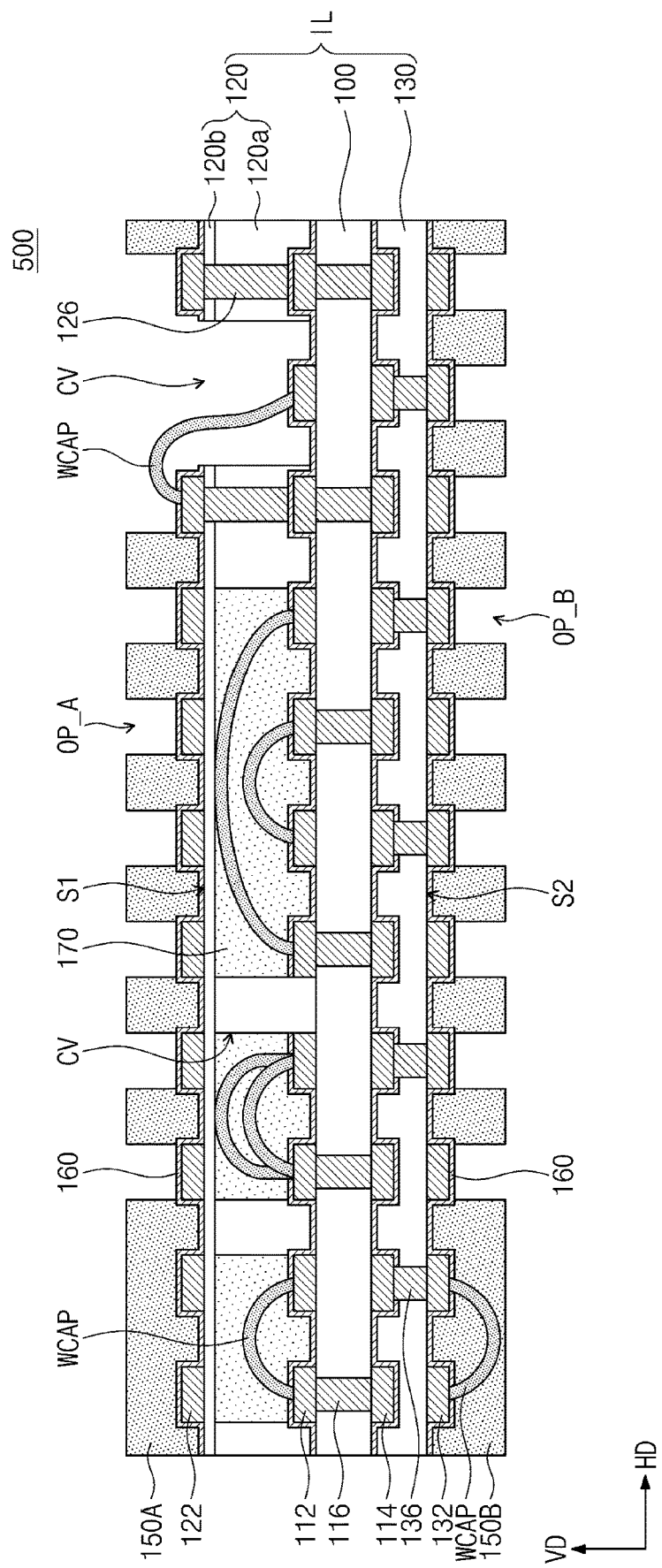

FIG. 15 is a sectional view illustrating a wiring board according to an embodiment of the inventive concept. For the sake of brevity, features, which are different from the wiring board described with reference to FIGS. 1 to 4, will be mainly described below.

Referring to FIG. 15, the insulating layer IL may include a cavity CV, which is formed to penetrate the same, and the capacitor wire WCAP may be disposed in the cavity CV. As an example, the upper insulating layer 120 may include a first upper insulating layer 120a and a second upper insulating layer 120b, which are sequentially stacked on the intermediate layer 100, and the first upper insulating layer 120a may include the cavity CV, which is formed to penetrate the same. The capacitor wire WCAP may be disposed in the cavity CV of the first upper insulating layer 120a and may be connected to corresponding ones of the first intermediate wiring patterns 112. The wiring board 500 may further include a mold layer 170, which is provided to fill the cavity CV and to cover the capacitor wire WCAP. The second upper insulating layer 120b may be disposed on the first upper insulating layer 120a and may be extended to a region on the mold layer 170. The mold layer 170 may be formed of or include an insulating polymer material and may further include glass fiber. Except for the afore-described features, the wiring board 500 according to the present embodiments may be substantially the same as the wiring board 500 described with reference to FIG. 14.

Figure 16:
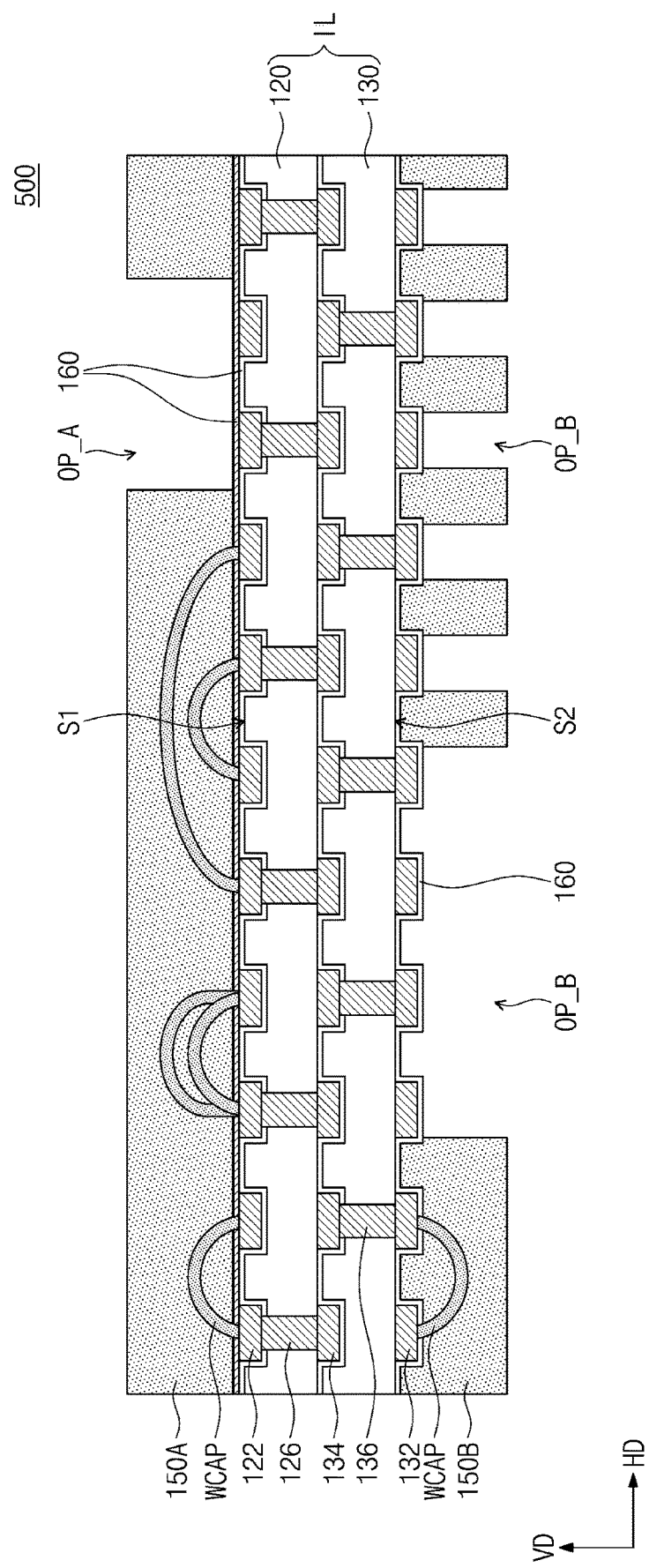

FIG. 16 is a sectional view illustrating a wiring board according to an embodiment of the inventive concept. For the sake of brevity, features, which are different from the wiring board described with reference to FIGS. 1 to 4, will be mainly described below.

Referring to FIG. 16, a wiring board 500 may include an insulating layer IL having a first surface S1 and a second surface S2, which are opposite to each other, upper wiring patterns 122 on the first surface S1 of the insulating layer IL, lower wiring patterns 132 on the second surface S2 of the insulating layer IL, and intermediate wiring patterns 134, which are disposed in the insulating layer IL and are electrically connected to the upper and lower wiring patterns 122 and 132.

The insulating layer IL may include an upper insulating layer 120 adjacent to the first surface S1 and a lower insulating layer 130 adjacent to the second surface S2. In an embodiment, the insulating layer IL may not include the intermediate layer 100 of FIG. 1. The wiring board 500 may be a core-less wiring board (e.g., a core-less printed circuit board), which does not include any core substrate.

The upper wiring patterns 122 may be disposed on the first surface S1 of the insulating layer IL and in the upper insulating layer 120. The upper wiring patterns 122 may be embedded in the upper insulating layer 120. The intermediate wiring patterns 134 may be disposed between the upper and lower insulating layers 120 and 130 and may be embedded in the lower insulating layer 130. The lower wiring patterns 132 may be disposed on the second surface S2 of the insulating layer IL and on the lower insulating layer 130.

The wiring board 500 may further include upper vias 126, which are disposed in the upper insulating layer 120 to electrically connect the upper wiring patterns 122 to the intermediate wiring patterns 134, and lower vias 136, which are disposed in the lower insulating layer 130 to electrically connect the lower wiring patterns 132 to the intermediate wiring patterns 134.

The wiring board 500 may include a capacitor wire WCAP, which is electrically connected to corresponding ones of the upper wiring patterns 122, corresponding ones of the lower wiring patterns 132, and corresponding ones of the intermediate wiring patterns 134. The capacitor wire WCAP may be connected to the corresponding wiring patterns 122, 132, and 134 by a wire bonding method. The capacitor wire WCAP may be substantially the same as the capacitor wire WCAP described with reference to FIGS. 2, 3A, and 3B. The capacitor wire WCAP may be connected to the corresponding wiring patterns 122, 132, and 134 by a ball bonding method or a wedge bonding method, as described with reference to FIG. 4. As an example, the capacitor wire WCAP may be disposed on the first surface S1 of the insulating layer IL and may be connected to corresponding ones of the upper wiring patterns 122. As another example, the capacitor wire WCAP may be disposed on the second surface S2 of the insulating layer IL and may be connected to corresponding ones of the lower wiring patterns 132.

The wiring board 500 may further include an upper mask layer 150A, which is disposed on the first surface S1 of the insulating layer IL, and a lower mask layer 150B, which is disposed on the second surface S2 of the insulating layer IL to cover the lower wiring patterns 132. The capacitor wire WCAP connected to the corresponding upper wiring patterns 122 may be disposed in the upper mask layer 150A, and the capacitor wire WCAP connected to the corresponding lower wiring patterns 132 may be disposed in the lower mask layer 150B.

The wiring board 500 may further include a protection layer 160, which is provided to cover surfaces of the upper wiring patterns 122, the lower wiring patterns 132, and the intermediate wiring patterns 134. The protection layer 160 may be disposed in the upper insulating layer 120 and may be interposed between the upper wiring patterns 122 and the upper insulating layer 120. The protection layer 160 may be disposed on the first surface S1 of the insulating layer IL to cover the upper wiring patterns 122 and the upper insulating layer 120. The protection layer 160 may be interposed between the upper wiring patterns 122 and the upper mask layer 150A and may be extended into a region between the upper insulating layer 120 and the upper mask layer 150A. The capacitor wire WCAP may be provided to penetrate the protection layer 160 and may be connected to the corresponding upper wiring patterns 122. The protection layer 160 may be disposed on the second surface S2 of the insulating layer IL to cover surfaces of the lower wiring patterns 132. The protection layer 160 may be interposed between the lower wiring patterns 132 and the lower mask layer 150B and may be extended into a region between the lower insulating layer 130 and the lower mask layer 150B. The capacitor wire WCAP may be provided to penetrate the protection layer 160 and may be connected to the corresponding lower wiring patterns 132. The protection layer 160 may be disposed in the lower insulating layer 130 and may be interposed between the intermediate wiring patterns 134 and the lower insulating layer 130. In an embodiment, the protection layer 160 may be omitted.

Except for the afore-described features, the wiring board 500 according to the present embodiments may be substantially the same as the wiring board 500 described with reference to FIGS. 1 to 4.

Figure 17:
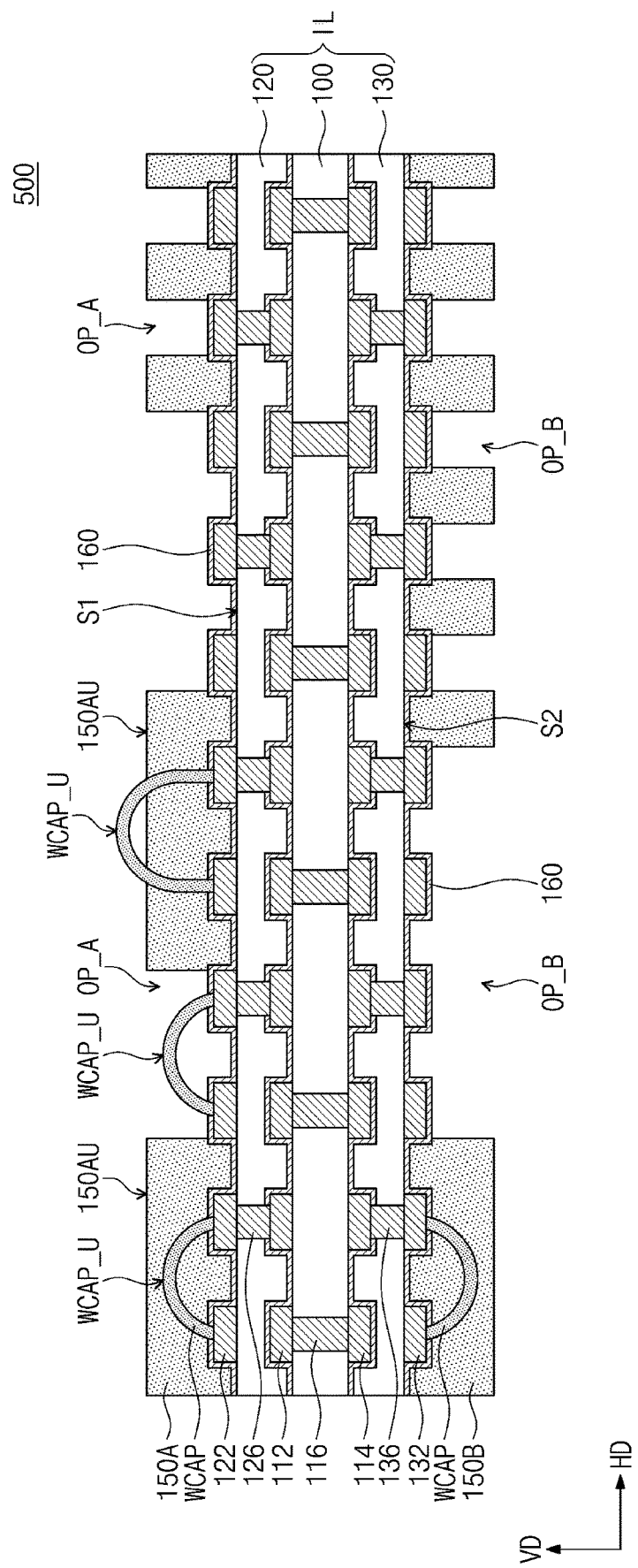

FIG. 17 is a sectional view illustrating a wiring board according to an embodiment of the inventive concept. For the sake of brevity, features, which are different from the wiring board described with reference to FIGS. 1 to 4, will be mainly described below.

Referring to FIG. 17, the capacitor wire WCAP may be disposed on the first surface S1 of the insulating layer IL and may be connected to corresponding ones of the upper wiring patterns 122. The wiring board 500 may further include an upper mask layer 150A, which is disposed on the first surface S1 of the insulating layer TL to cover the upper wiring patterns 122, and the capacitor wire WCAP may be disposed in the upper mask layer 150A. In an embodiment, a height of the topmost surface WCAP_U of the capacitor wire WCAP may be higher or lower than a height of a top surface 150AU of the upper mask layer 150A. Here, the height may be a distance from the first surface S1 of the insulating layer IL in the vertical direction VD. In the case where the height of the topmost surface WCAP_U of the capacitor wire WCAP is lower than the height of the top surface 150AU of the upper mask layer 150A, the capacitor wire WCAP may be fully embedded in the upper mask layer 150A. In the case where the height of the topmost surface WCAP_U of the capacitor wire WCAP is higher than the height of the top surface 150AU of the upper mask layer 150A, a lower portion of the capacitor wire WCAP may be embedded in the upper mask layer 150A, and an upper portion of the capacitor wire WCAP may protrude from the upper mask layer 150A.

The upper mask layer 150A may include upper openings OP_A. The upper openings OP_A may be vertically overlapped (e.g., in the vertical direction VD) with corresponding ones of the upper wiring patterns 122 and may expose the protection layer 160 on the corresponding upper wiring patterns 122. In an embodiment, the capacitor wire WCAP may be disposed in a corresponding one of the upper openings OP_A and may be connected to upper wiring patterns 122, which are vertically overlapped with the corresponding upper opening OP_A.

The capacitor wire WCAP may be disposed on the second surface S2 of the insulating layer IL and may be connected to corresponding ones of the lower wiring patterns 132. The wiring board 500 may further include a lower mask layer 150B, which is disposed on the second surface S2 of the insulating layer IL to cover the lower wiring patterns 132, and the capacitor wire WCAP may be disposed in the lower mask layer 150B. Although not shown, the heights of the capacitor wire WCAP and the lower mask layer 150B may be configured to have the same feature as those of the capacitor wire WCAP and the upper mask layer 150A.

Figure 18:
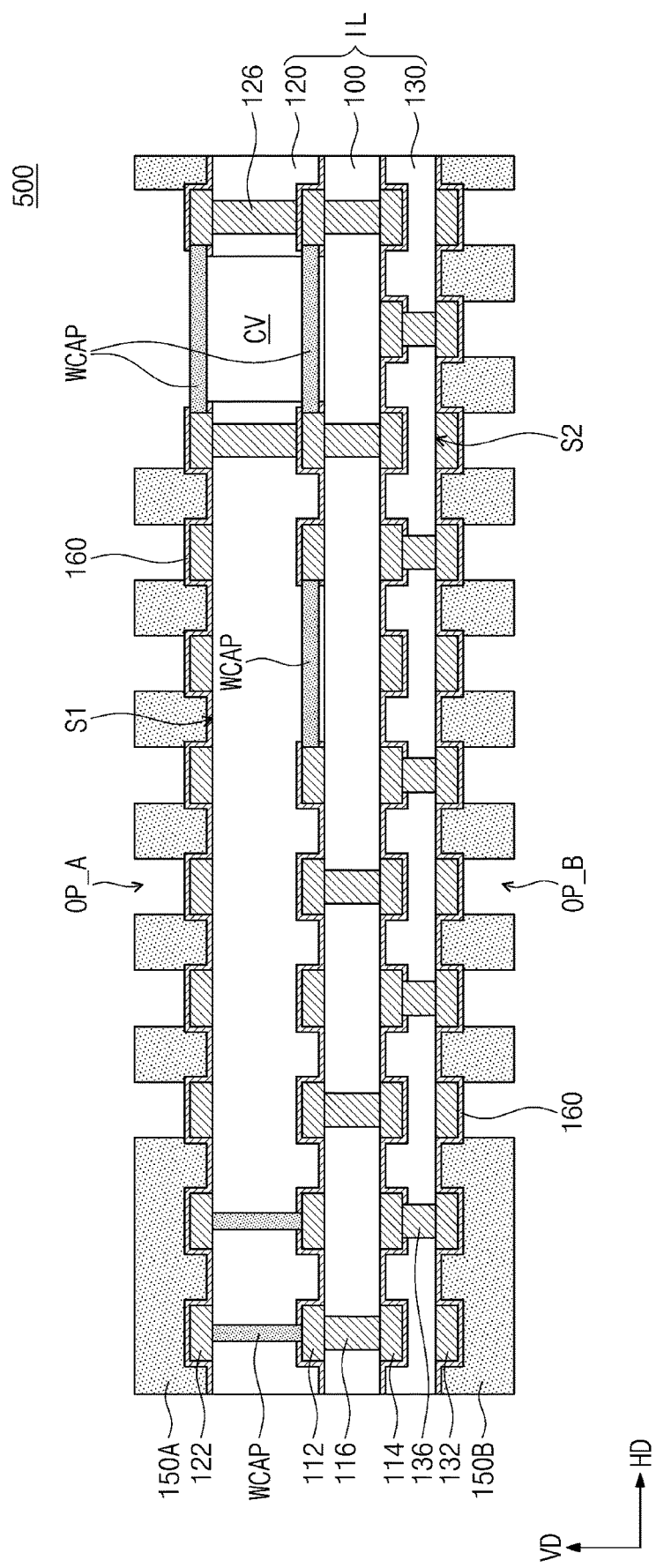

FIG. 18 is a sectional view illustrating a wiring board according to an embodiment of the inventive concept. For the sake of brevity, features, which are different from the wiring board described with reference to FIGS. 1 to 4, will be mainly described below.

Referring to FIG. 18, in an embodiment, the capacitor wire WCAP may be connected to side surfaces of corresponding ones of the upper wiring patterns 122 and may have a line shape extending in a horizontal direction HD parallel to the first surface S1 of the insulating layer IL. In another embodiment, the capacitor wire WCAP may be connected to side surfaces of corresponding ones of the first intermediate wiring patterns 112 and may have a line shape extending in the horizontal direction HD. Although not shown, the capacitor wire WCAP may be connected to side surfaces of corresponding ones of the second intermediate wiring patterns 114 or to side surfaces of corresponding ones of the lower wiring patterns 132 and may have a line shape extending in the horizontal direction HD.

In an embodiment, the upper insulating layer 120 may include a cavity CV, which is formed to penetrate the same, and the capacitor wire WCAP, which has a line shape extending in the horizontal direction HD, may be disposed in the cavity CV.

In another embodiment, the capacitor wire WCAP may be disposed between a corresponding one of the upper wiring patterns 122 and a corresponding one of the first intermediate wiring patterns 112 and may be connected to the corresponding upper wiring pattern 122 and the corresponding first intermediate wiring pattern 112. The capacitor wire WCAP may have a line shape extending in the vertical direction VD, between the corresponding upper wiring pattern 122 and the corresponding first intermediate wiring pattern 112. In this case, the capacitor wire WCAP may be disposed in the upper insulating layer 120. Although not shown, the capacitor wire WCAP may be connected to one of the first intermediate wiring patterns 112 and one of the second intermediate wiring patterns 114 or may be connected to one of the second intermediate wiring patterns 114 and one of the lower wiring patterns 132 and may have a line shape extending in the vertical direction VD.

Figure 19:
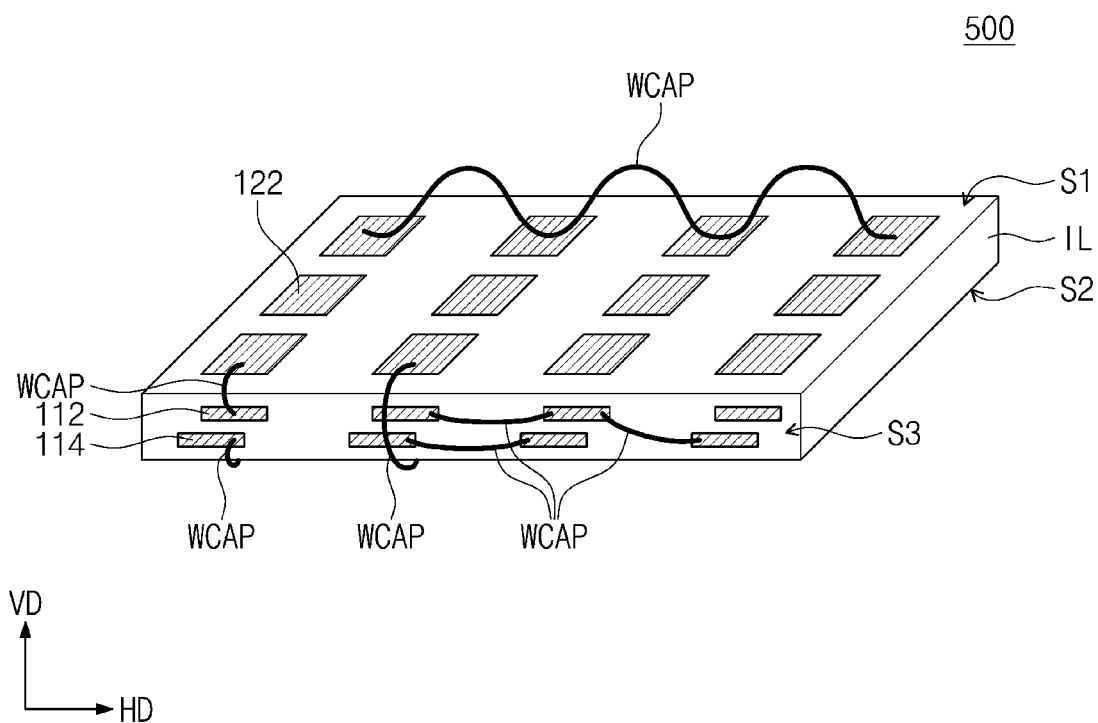
FIG. 19 is a diagram schematically illustrating capacitor wires, which are embedded in a wiring board according to an embodiment of the inventive concept.

FIG. 19 is a diagram schematically illustrating capacitor wires, which are embedded in a wiring board according to an embodiment of the inventive concept. For the sake of brevity, features, which are different from the wiring board described with reference to FIGS. 1 to 4, will be mainly described below.

Referring to FIG. 19, the capacitor wire WCAP may be disposed on the first surface S1 of the insulating layer IL and may be connected to ones of the upper wiring patterns 122 by a stitch bonding method. In this case, the capacitor wire WCAP may include outer electrode segments, which are spaced apart from each other in a longitudinal or extension direction of the capacitor wire WCAP, and the outer electrode segments may be connected to the upper wiring patterns 122, respectively, by a stitch bonding method. The capacitor wire WCAP, which is connected to the upper wiring patterns 122, may have a plurality of arch-shaped portions.

The insulating layer IL may have a side surface S3 between the first surface S1 and the second surface S2. Some of the wiring patterns 122, 112, 114, and 132 may be exposed through the side surface S3 of the insulating layer IL. On the side surface S3 of the insulating layer IL, the capacitor wire WCAP may be connected to corresponding ones of the exposed wiring patterns 122, 112, 114, and 132 by a wire bonding method. As an example, some of the intermediate wiring patterns 112 and 114 may be exposed through the side surface S3 of the insulating layer IL, and on the side surface S3 of the insulating layer IL, the capacitor wire WCAP may be connected to the exposed intermediate wiring patterns 112 and 114 by the wire bonding method.

FIGS. 20 to 23 are perspective views schematically illustrating a portion of a wiring board according to an embodiment of the inventive concept. For the sake of brevity, features, which are different from the wiring board described with reference to FIGS. 1 to 4, will be mainly described below.

Referring to FIGS. 20 to 23, the wiring board 500 may further include at least one pillar structure 140 disposed on the first surface S1 of the insulating layer IL. The pillar structure 140 may be an insulating pillar, which is formed of an insulating material, or a conductive pillar, which is formed of a conductive material. In the case where the pillar structure 140 is the conductive pillar, the pillar structure 140 may be formed of or include the same material (e.g., the same metallic material) as the upper wiring patterns 122 and may be electrically connected to the intermediate wiring patterns 112 and 114 and the lower wiring patterns 132 of FIG. 1.

A height of the pillar structure 140 may be a height 140H. The height 140H may have a value selected from a range between 30 μm to 150 μm, when measured in the vertical direction VD perpendicular to the first surface S1 of the insulating layer IL. A diameter of the pillar structure 140, which is measured in the horizontal direction HD parallel to the first surface S1 of the insulating layer IL, may be a diameter 140D of about 120 μm. In the case where the upper mask layer 150A is disposed on the first surface S1 of the insulating layer IL, at least a portion of the pillar structure 140 may be embedded in the upper mask layer 150A. According to an embodiment of the inventive concept, in this case, the height 140H of the pillar structure 140 may be about 35 μm, and a pitch (e.g., a distance) between the pillar structures 140 may be about 140 μm.

As described with reference to FIGS. 5 to 12, the capacitor wire WCAP may have a first end portion E1 and a second end portion E2, which are opposite to each other in a longitudinal direction of the capacitor wire WCAP (e.g., in the longitudinal or extension direction LD of the core electrode line 10 described with reference to FIGS. 2 to 4). The capacitor wire WCAP may be disposed on the first surface S1 of the insulating layer IL and may be wound around the at least one pillar structure 140.

Figure 20:
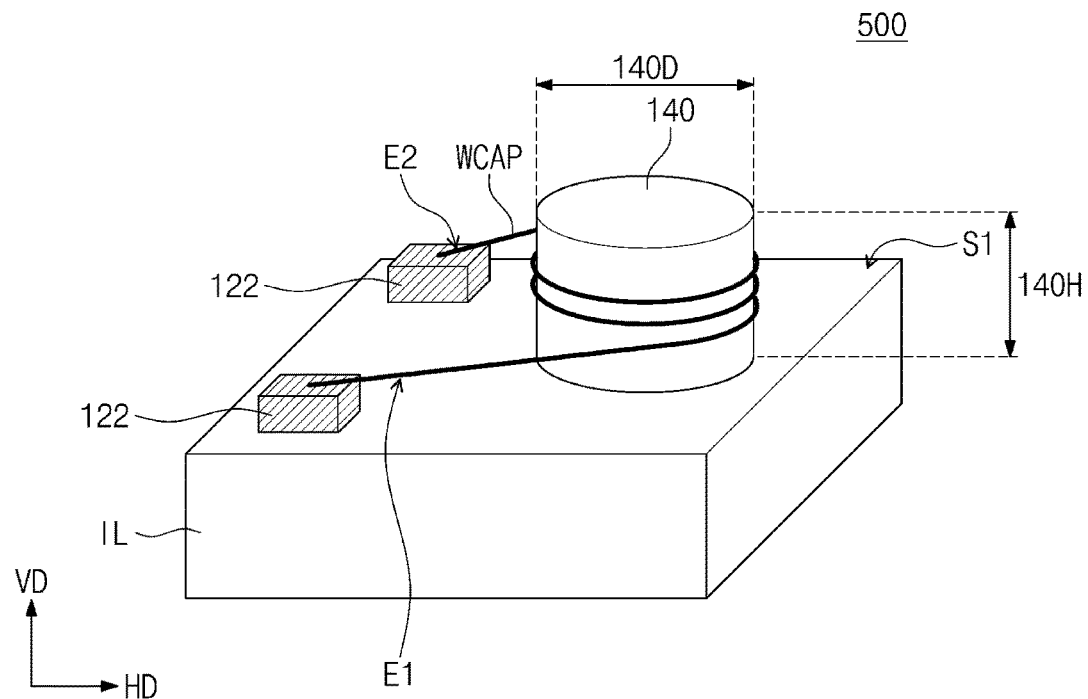
FIGS. 20 to 23 are perspective views schematically illustrating a portion of a wiring board according to an embodiment of the inventive concept.

In an embodiment, as shown in FIG. 20, the capacitor wire WCAP may be wound around the pillar structure 140, and the first end portion E1 of the capacitor wire WCAP may be connected to one of the upper wiring patterns 122. The second end portion E2 of the capacitor wire WCAP may be connected to another of the upper wiring patterns 122.

Figure 21:
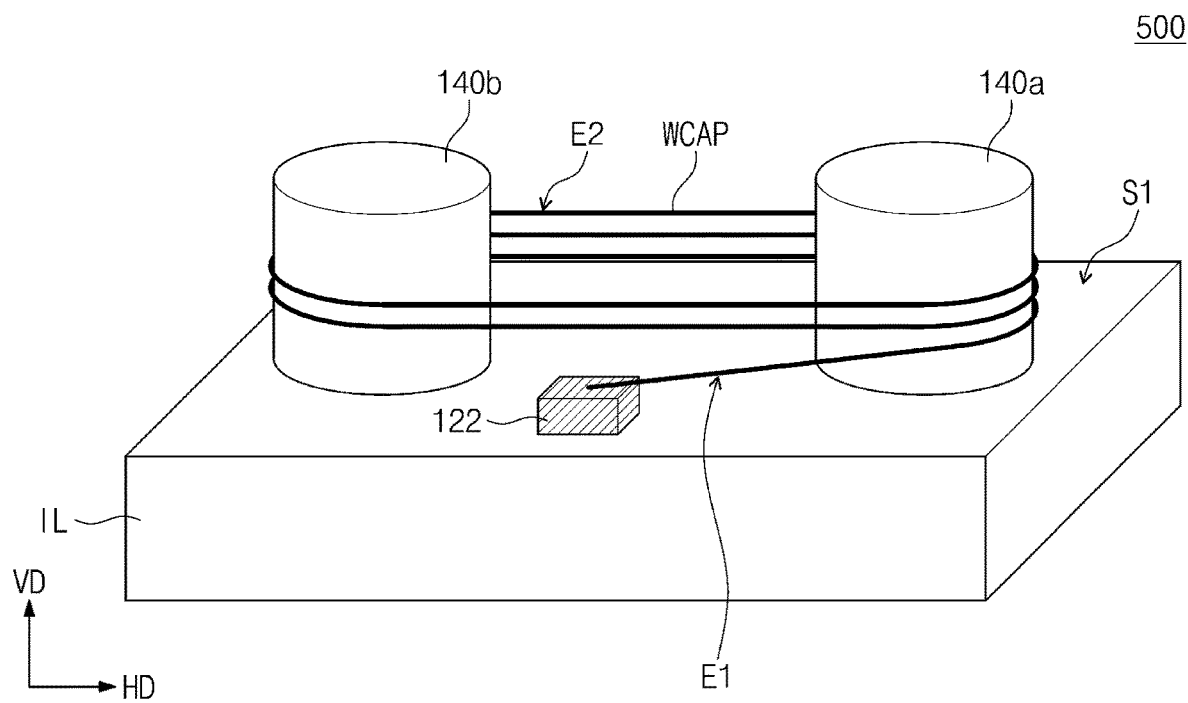

In another embodiment, as shown in FIG. 21, the capacitor wire WCAP may be provided to be wound around a plurality of pillar structures 140a and 140b. The first end portion E1 of the capacitor wire WCAP may be connected to one of the upper wiring patterns 122, and the second end portion E2 of the capacitor wire WCAP may be connected to one (e.g., 140b) of the pillar structures 140a and 140b. In this case, the one 140b of the pillar structures 140a and 140b may be a conductive pillar.

Figure 22:
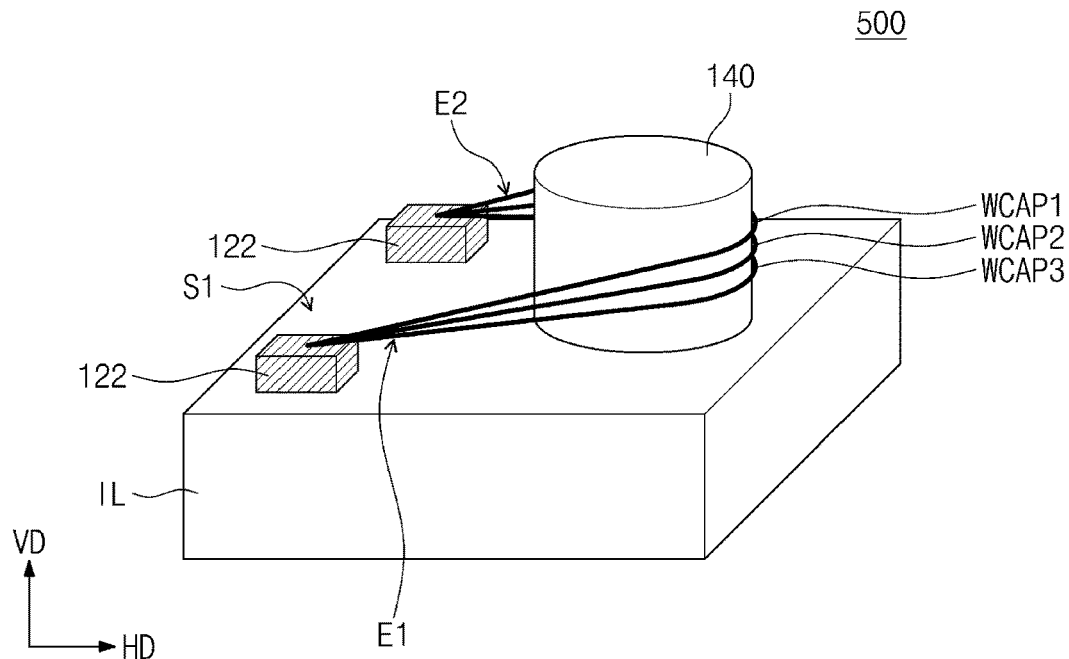

In still another embodiment, as shown in FIG. 22, a plurality of capacitor wires WCAP1, WCAP2, and WCAP3 may be disposed on the first surface S1 of the insulating layer IL, and each of the capacitor wires WCAP1, WCAP2, and WCAP3 may be provided to be wound around the at least one pillar structure 140. First end portions E1 of the capacitor wires WCAP1, WCAP2, and WCAP3 may be connected in common to one of the upper wiring patterns 122, and second end portions E2 of the capacitor wires WCAP1, WCAP2, and WCAP3 may be connected in common to another of the upper wiring patterns 122.

Figure 23:
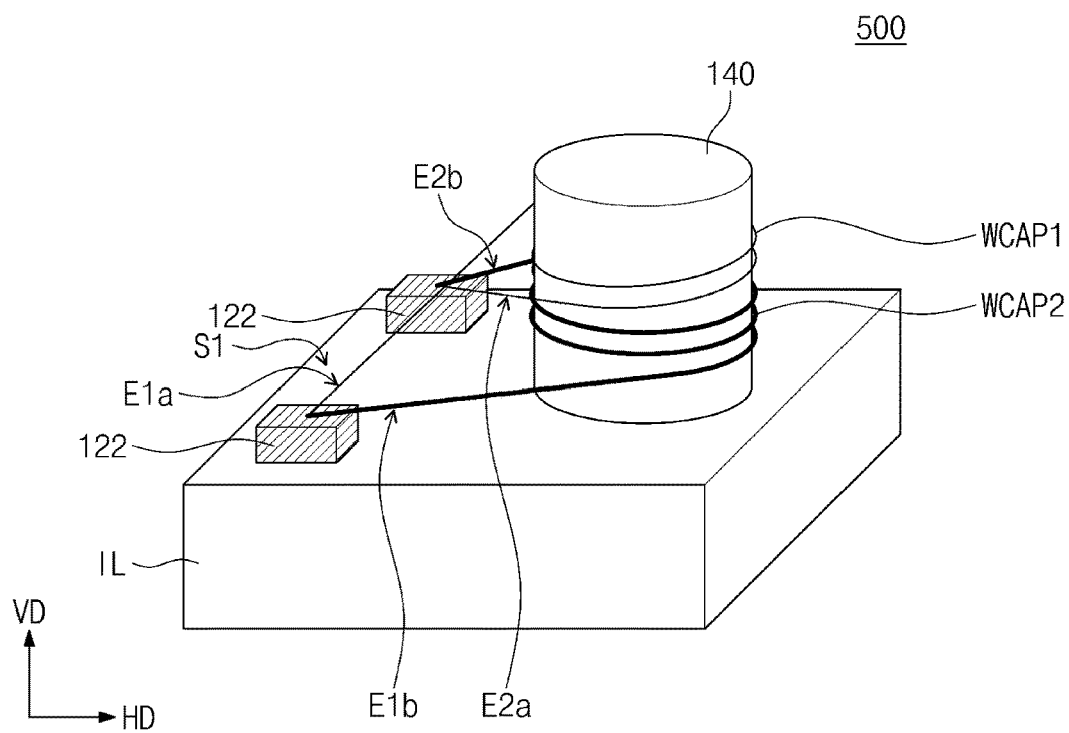

In yet another embodiment, as shown in FIG. 23, a plurality of capacitor wires WCAP1 and WCAP2 may be disposed on the first surface S1 of the insulating layer IL, and each of the capacitor wires WCAP1 and WCAP2 may be provided to be wound around the at least one pillar structure 140. A first capacitor wire WCAP1, which is one of the capacitor wires WCAP1 and WCAP2, may be wound around the at least one pillar structure 140 in a clockwise direction, and a second capacitor wire WCAP2, which is the other of the capacitor wires WCAP1 and WCAP2, may be wound around the at least one pillar structure 140 in a counter-clockwise direction. A first end portion E1a of the first capacitor wire WCAP1 and a first end portion E1b of the second capacitor wire WCAP2 may be connected in common to one of the upper wiring patterns 122, and a second end portion E2a of the first capacitor wire WCAP1 and a second end portion E2b of the second capacitor wire WCAP2 may be connected in common to another of the upper wiring patterns 122.

According to the present embodiments, since the capacitor wire WCAP is provided to be wound around the at least one pillar structure 140, an electrostatic capacitance of the capacitor wire WCAP may be increased. In addition, as described with reference to FIG. 23, in the case where the capacitor wires WCAP1 and WCAP2 are wound around the at least one pillar structure 140 in opposite directions, inductances of the capacitor wires WCAP1 and WCAP2 may be canceled, and thus, it may be possible to prevent or suppress the inductances of the capacitor wires WCAP1 and WCAP2 from affecting circuits, which are placed near the capacitor wires WCAP1 and WCAP2.

Figure 24:
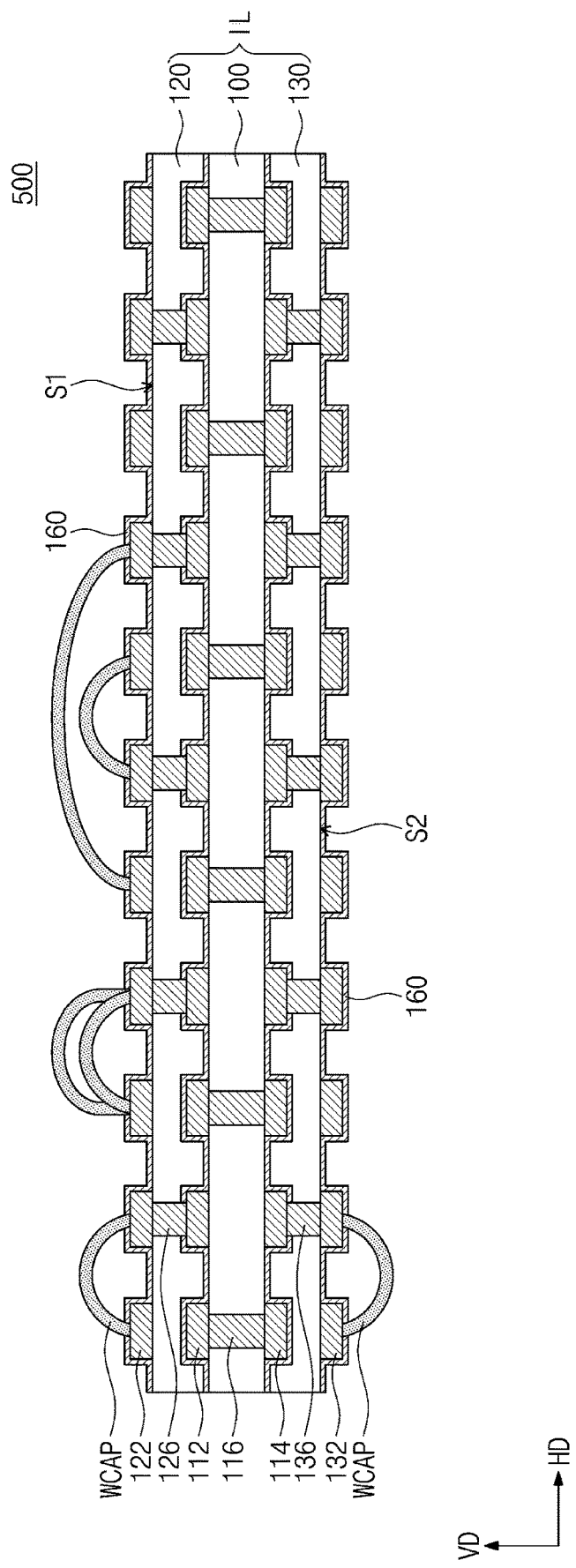
FIG. 24 is a sectional view illustrating an example method of fabricating a wiring board according to an embodiment of the inventive concept.

FIG. 24 is a sectional view illustrating an example method of fabricating a wiring board according to an embodiment of the inventive concept. For the sake of brevity, an element in the wiring board described with reference to FIGS. 1 to 4 may be identified by the same reference number without repeating an overlapping description thereof.

Referring to FIG. 24, an intermediate layer 100 may be provided. The intermediate layer 100 may include a core substrate. The core substrate may be formed of or include an insulating polymer material and may further include glass fiber. Alternatively, the core substrate may be formed of or include a metallic material (e.g., copper and aluminum). In an embodiment, the intermediate layer 100 may include a plurality of intermediate insulating layers, which are stacked in the vertical direction VD, and the core substrate, which is interposed between the intermediate insulating layers.

First intermediate wiring patterns 112 may be formed on one surface of the intermediate layer 100, and second intermediate wiring patterns 114 may be formed on an opposite surface of the intermediate layer 100. Intermediate vias 116 may be formed in the intermediate layer 100. The intermediate vias 116 may be formed to penetrate the intermediate layer 100 and may electrically connect the first intermediate wiring patterns 112 to the second intermediate wiring patterns 114. In an embodiment, the formation of the first intermediate wiring patterns 112 may include forming a conductive layer on the one surface of the intermediate layer 100 and patterning the conductive layer. The second intermediate wiring patterns 114 may be formed by substantially the same method as that for the first intermediate wiring patterns 112. In an embodiment, the formation of the intermediate vias 116 may include forming intermediate via holes to penetrate the intermediate layer 100 and performing a plating process to form the intermediate vias 116 filling the intermediate via holes.

A protection layer 160 may be formed on the one surface of the intermediate layer 100 to cover surfaces of the first intermediate wiring patterns 112. In addition, the protection layer 160 may be formed on the opposite surface of the intermediate layer 100 to cover surfaces of the second intermediate wiring patterns 114.

An upper insulating layer 120 may be formed on the one surface of the intermediate layer 100 to cover the first intermediate wiring patterns 112 and the protection layer 160. A lower insulating layer 130 may be formed on the opposite surface of the intermediate layer 100 to cover the second intermediate wiring patterns 114 and the protection layer 160. In an embodiment, the formation of the upper and lower insulating layers 120 and 130 may include forming respective insulating layers on the opposite surfaces of the intermediate layer 100 and performing a thermo-compression process on the insulating layers.

Upper wiring patterns 122 may be formed on the upper insulating layer 120. In an embodiment, the formation of the upper wiring patterns 122 may include forming an upper conductive layer on the upper insulating layer 120 and patterning the upper conductive layer. Upper vias 126 may be formed in the upper insulating layer 120 to electrically connect the upper wiring patterns 122 to the first intermediate wiring patterns 112. The upper vias 126 may be formed by substantially the same method as that for the intermediate vias 116. The protection layer 160 may be formed on the upper insulating layer 120 to cover surfaces of the upper wiring patterns 122.

Lower wiring patterns 132 may be formed on the lower insulating layer 130. In an embodiment, the formation of the lower wiring patterns 132 may include forming a lower conductive layer on the lower insulating layer 130 and patterning the lower conductive layer. Lower vias 136 may be formed in the lower insulating layer 130 to electrically connect the lower wiring patterns 132 to the second intermediate wiring patterns 114. The lower vias 136 may be formed by substantially the same method as that for the intermediate vias 116. The protection layer 160 may be formed on the lower insulating layer 130 to cover surfaces of the lower wiring patterns 132.

A capacitor wire WCAP may be provided on the upper insulating layer 120 and may be electrically connected to corresponding ones of the upper wiring patterns 122. In addition, the capacitor wire WCAP may be provided on the lower insulating layer 130 and may be electrically connected to corresponding ones of the lower wiring patterns 132. The capacitor wire WCAP may be provided to penetrate the protection layer 160 and may be connected to the corresponding upper wiring patterns 122 or the corresponding lower wiring patterns 132. The capacitor wire WCAP may be connected to the corresponding upper wiring patterns 122 or the corresponding lower wiring patterns 132 by a wire bonding method. In an embodiment, the formation of the protection layer 160 may be omitted.

Referring back to FIGS. 1 and 13, a lower mask layer 150B may be formed on the lower insulating layer 130 to cover the lower wiring patterns 132 and the protection layer 160. The lower mask layer 150B may cover the capacitor wire WCAP connected to the corresponding lower wiring patterns 132. In an embodiment, as described with reference to FIG. 1, an upper mask layer 150A may be formed on the upper insulating layer 120 to cover the upper wiring patterns 122 and the protection layer 160. The upper mask layer 150A may cover the capacitor wire WCAP connected to the corresponding upper wiring patterns 122. In another embodiment, the formation of the upper mask layer 150A may be omitted, as described with reference to FIG. 13.

Figure 25:
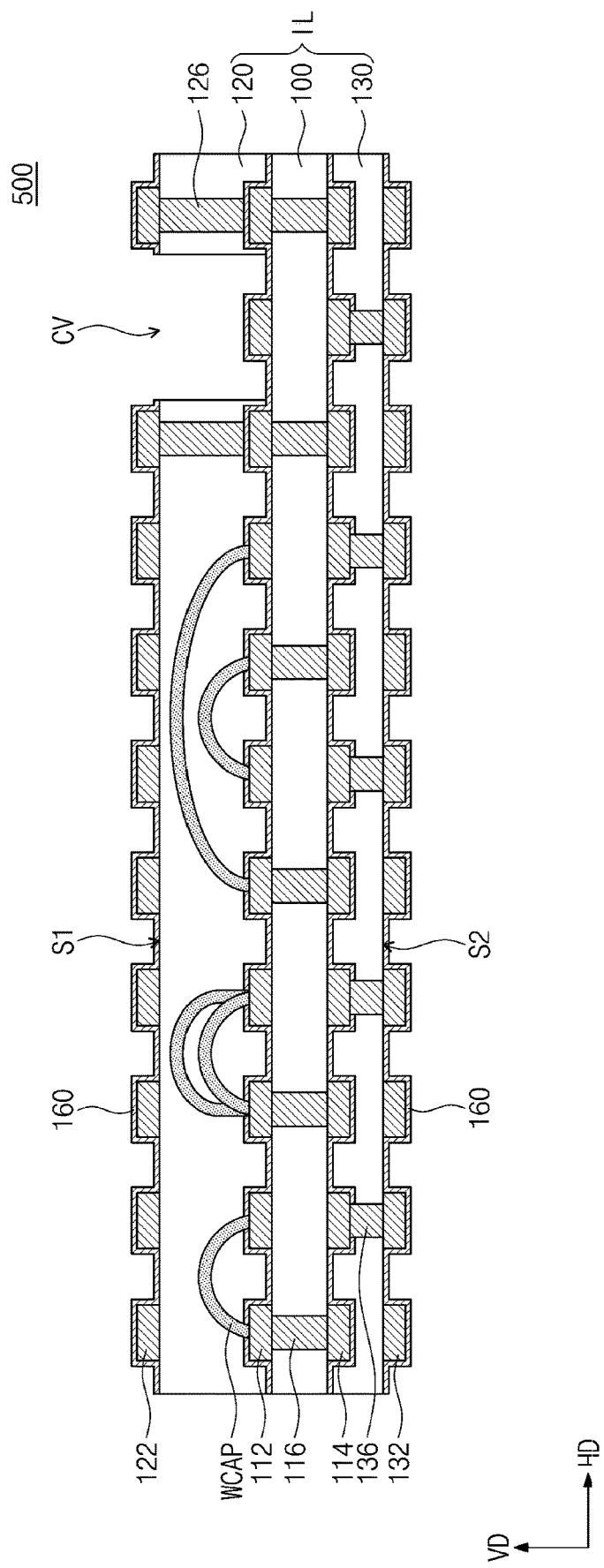
FIGS. 25, 26, 27A, and 27B are sectional views illustrating an example method of fabricating a wiring board according to an embodiment of the inventive concept.

FIG. 25 is a sectional view illustrating an example method of fabricating a wiring board according to an embodiment of the inventive concept. For the sake of brevity, features, which are different from the fabricating method described with reference to FIG. 24, will be described below.

Referring to FIG. 25, the first intermediate wiring patterns 112 may be formed on one surface of the intermediate layer 100, and the second intermediate wiring patterns 114 may be formed on an opposite surface of the intermediate layer 100. The intermediate vias 116 may be formed in the intermediate layer 100. The protection layer 160 may be formed to cover surfaces of the first and second intermediate wiring patterns 112 and 114.

The capacitor wire WCAP may be provided on the one surface of the intermediate layer 100 and may be electrically connected to corresponding ones of the first intermediate wiring patterns 112. The capacitor wire WCAP may be provided to penetrate the protection layer 160 and may be connected to the corresponding first intermediate wiring patterns 112. The capacitor wire WCAP may be connected to the corresponding first intermediate wiring patterns 112 by a wire bonding method.

The upper insulating layer 120 may be formed on the one surface of the intermediate layer 100 to cover the first intermediate wiring patterns 112, the protection layer 160, and the capacitor wire WCAP. The lower insulating layer 130 may be formed on the opposite surface of the intermediate layer 100 to cover the second intermediate wiring patterns 114 and the protection layer 160. Unlike that illustrated in the drawings, the capacitor wire WCAP may be electrically connected to corresponding ones of the second intermediate wiring patterns 114. In this case, the lower insulating layer 130 may cover the second intermediate wiring patterns 114, the protection layer 160, and the capacitor wire WCAP.

In an embodiment, a cavity CV may be formed to penetrate the upper insulating layer 120. The cavity CV may be formed to expose corresponding ones of the first intermediate wiring patterns 112 and the protection layer 160 on the corresponding first intermediate wiring patterns 112.

The upper and lower wiring patterns 122 and 132 may be formed on the upper and lower insulating layers 120 and 130, respectively. The protection layer 160 may be formed on the upper and lower insulating layers 120 and 130 to cover surfaces of the upper and lower wiring patterns 122 and 132. In an embodiment, the formation of the protection layer 160 may be omitted.

Referring back to FIG. 14, in an embodiment, the capacitor wire WCAP may be provided in the cavity CV and may be connected to one of the upper wiring patterns 122 and one of the first intermediate wiring patterns 112 by a wire bonding method. The lower mask layer 150B may be formed on the lower insulating layer 130 to cover the lower wiring patterns 132 and the protection layer 160. The upper mask layer 150A may be formed on the upper insulating layer 120 to cover the upper wiring patterns 122 and the protection layer 160.

Figure 26:
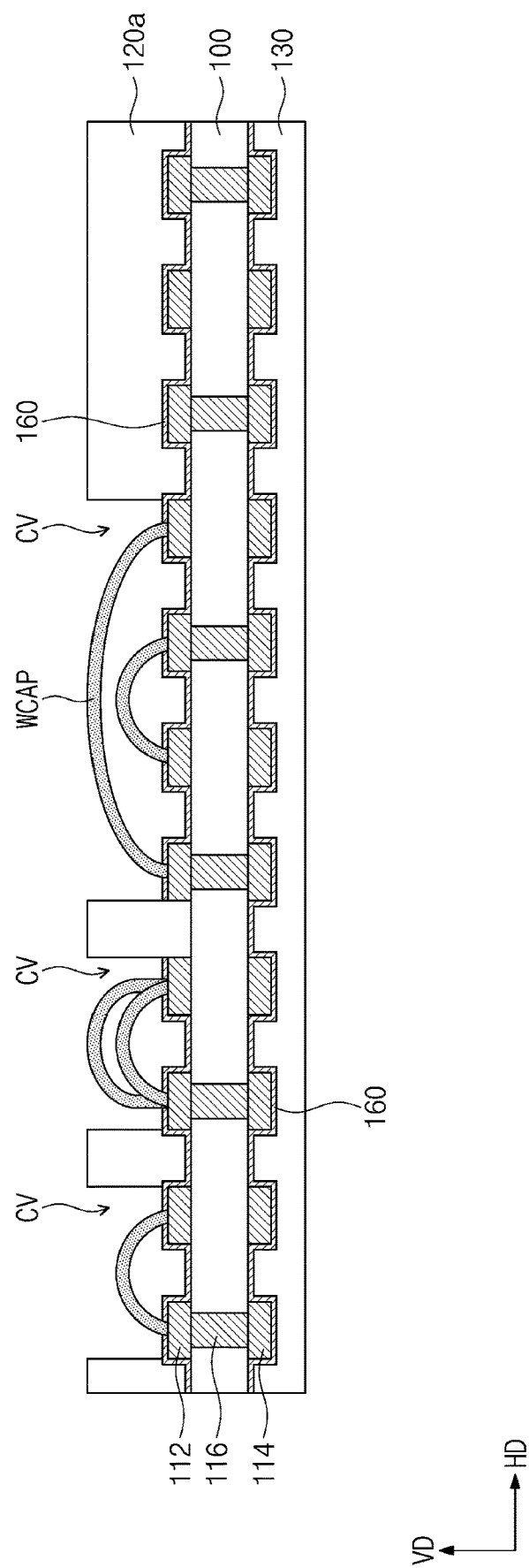

FIG. 26 is a sectional view illustrating an example method of fabricating a wiring board according to an embodiment of the inventive concept. For the sake of brevity, features, which are different from the fabricating method described with reference to FIG. 24, will be described below.

Referring to FIG. 26, a first upper insulating layer 120a may be formed on the one surface of the intermediate layer 100 to cover the first intermediate wiring patterns 112 and the protection layer 160. The lower insulating layer 130 may be formed on the opposite surface of the intermediate layer 100 to cover the second intermediate wiring patterns 114 and the protection layer 160. In an embodiment, the formation of the first upper insulating layer 120a and the lower insulating layer 130 may include forming respective insulating layers on the opposite surfaces of the intermediate layer 100 and performing a thermo-compression process on the insulating layers.

In an embodiment, a cavity CV may be formed to penetrate the first upper insulating layer 120a. The cavity CV may be formed to expose corresponding ones of the first intermediate wiring patterns 112 and the protection layer 160 on the corresponding first intermediate wiring patterns 112. The capacitor wire WCAP may be provided in the cavity CV of the first upper insulating layer 120a and may be connected to corresponding ones of the first intermediate wiring patterns 112 by a wire bonding method.

Referring back to FIG. 15, a mold layer 170 may be formed to fill the cavity CV and to cover the capacitor wire WCAP. A second upper insulating layer 120b may be formed to cover the first upper insulating layer 120a and the mold layer 170. The first upper insulating layer 120a and the second upper insulating layer 120b may constitute an upper insulating layer 120.

In an embodiment, an additional cavity CV may be formed to penetrate the first upper insulating layer 120a and the second upper insulating layer 120b. The additional cavity CV may be formed to expose corresponding ones of the first intermediate wiring patterns 112 and the protection layer 160 on the corresponding first intermediate wiring patterns 112.

The upper and lower wiring patterns 122 and 132 may be formed on the upper insulating layer 120 (e.g., the second upper insulating layer 120b) and the lower insulating layer 130, respectively. The protection layer 160 may be formed on the upper insulating layer 120 (e.g., the second upper insulating layer 120b) and the lower insulating layer 130 and may cover surfaces of the upper and lower wiring patterns 122 and 132. An additional capacitor wire WCAP may be provided in the additional cavity CV and may be connected to one of the upper wiring patterns 122 and one of the first intermediate wiring patterns 112 by a wire bonding method. The lower mask layer 150B may be formed on the lower insulating layer 130 to cover the lower wiring patterns 132 and the protection layer 160. The upper mask layer 150A may be formed on the upper insulating layer 120 (e.g., the second upper insulating layer 120b) to cover the upper wiring patterns 122 and the protection layer 160.

Figure 27A:
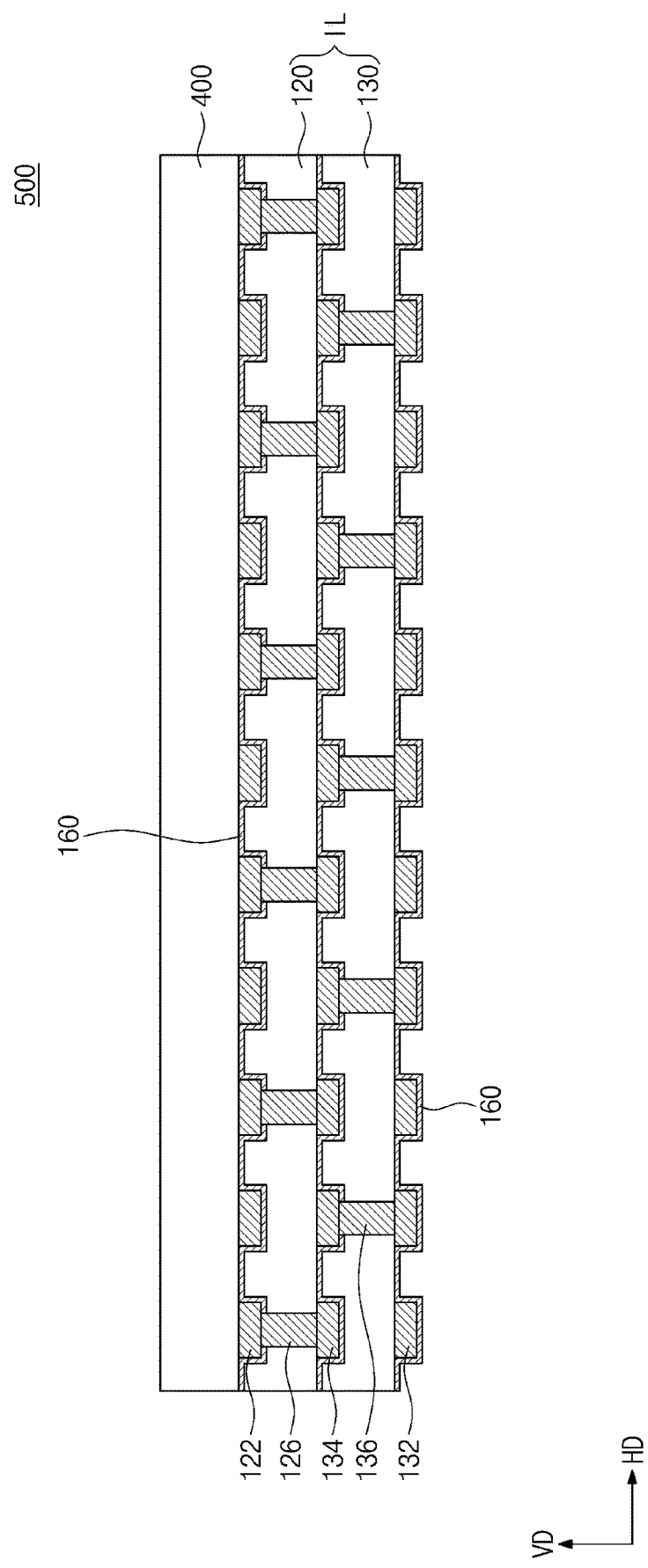
Figure 27B:
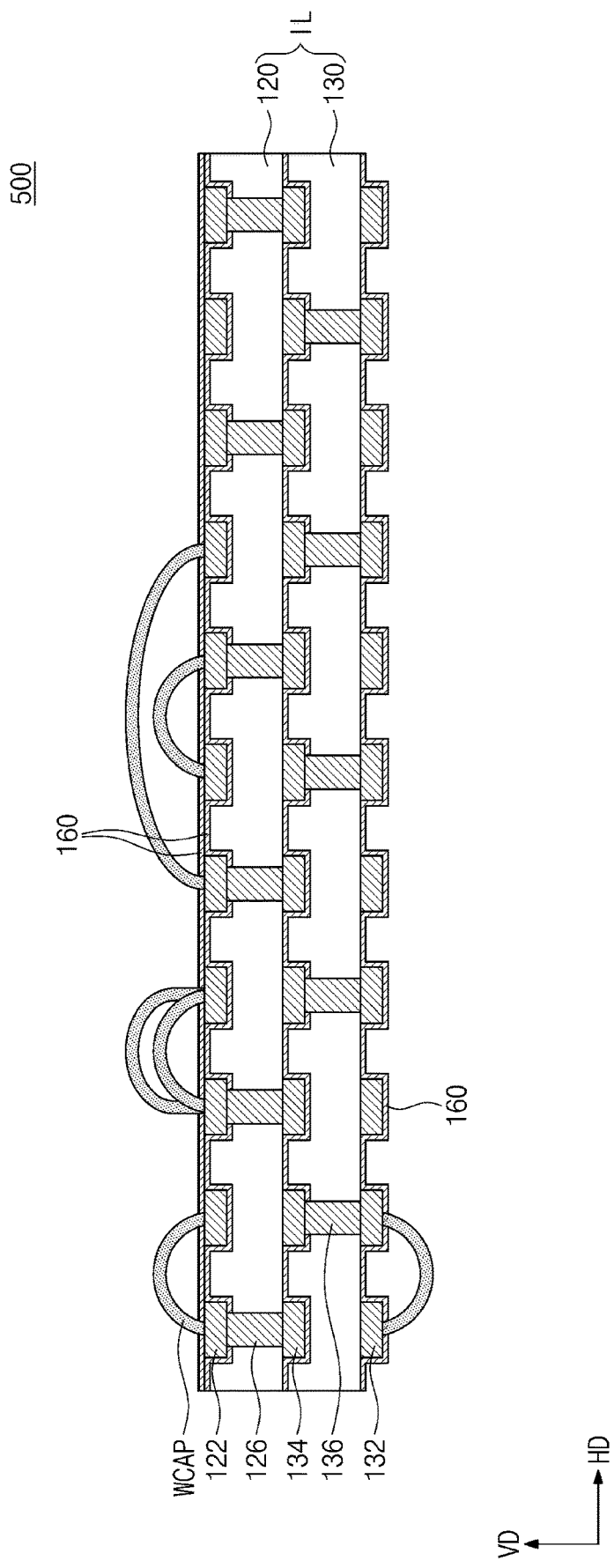

FIGS. 27A and 27B are sectional views illustrating an example method of fabricating a wiring board according to an embodiment of the inventive concept.

Referring to FIG. 27A, upper wiring patterns 122 may be formed on a carrier substrate 400. In an embodiment, the formation of the upper wiring patterns 122 may include forming a conductive layer on the carrier substrate 400 using a plating process and patterning the conductive layer. A protection layer 160 may be formed on the carrier substrate 400 to cover surfaces of the upper wiring patterns 122.

An upper insulating layer 120 may be formed on the carrier substrate 400 to cover the upper wiring patterns 122 and the protection layer 160. Upper vias 126 may be formed in the upper insulating layer 120, and intermediate wiring patterns 134 may be formed on the upper insulating layer 120. In an embodiment, the formation of the upper vias 126 may include forming upper via holes to penetrate the upper insulating layer 120 and performing a plating process to form the upper vias 126 filling the upper via holes. The intermediate wiring patterns 134 may be formed by substantially the same method as that for the upper wiring patterns 122. The upper vias 126 may electrically connect the upper wiring patterns 122 to the intermediate wiring patterns 134. The protection layer 160 may be formed on the upper insulating layer 120 to cover surfaces of the intermediate wiring patterns 134.

A lower insulating layer 130 may be formed on the upper insulating layer 120 to cover the intermediate wiring patterns 134 and the protection layer 160. Lower vias 136 may be formed in the lower insulating layer 130, and lower wiring patterns 132 may be formed on the lower insulating layer 130. The lower vias 136 may be formed by substantially the same method as that for the upper vias 126, and the lower wiring patterns 132 may be formed by substantially the same method as that for the upper wiring patterns 122. The lower vias 136 may electrically connect the lower wiring patterns 132 to the intermediate wiring patterns 134. The protection layer 160 may be formed on the lower insulating layer 130 to cover surfaces of the lower wiring patterns 132. In an embodiment, the formation of the protection layer 160 may be omitted.

Referring to FIG. 27B, the carrier substrate 400 may be removed. In an embodiment, the removal of the carrier substrate 400 may include detaching the carrier substrate 400 from the upper insulating layer 120 and the upper wiring patterns 122. As a result of the removal of the carrier substrate 400, portions of the protection layer 160 on one surface of the upper insulating layer 120 and portions of the upper wiring patterns 122 may be exposed. Another protection layer 160 may be formed on the exposed surface of the initial protection layer 160 and may be formed to cover the exposed portions of the upper wiring patterns 122. The upper wiring patterns 122 may be embedded in the upper insulating layer 120. The protection layer 160 may be embedded in the upper insulating layer 120 and may be interposed between the upper wiring patterns 122 and the upper insulating layer 120. When the protection layer 160 is omitted, as a result of the removal of the carrier substrate 400, one surface of the upper insulating layer 120 and portions of the upper wiring patterns 122 may be exposed.

A capacitor wire WCAP may be connected to corresponding ones of the upper wiring patterns 122, and/or corresponding ones of the lower wiring patterns 132 by a wire bonding method.

Referring back to FIG. 16, an upper mask layer 150A may be formed on the upper insulating layer 120 to cover the capacitor wire WCAP connected to the corresponding upper wiring patterns 122. A lower mask layer 150B may be formed on the lower insulating layer 130 to cover the capacitor wire WCAP connected to the corresponding lower wiring patterns 132.

Figure 28A:
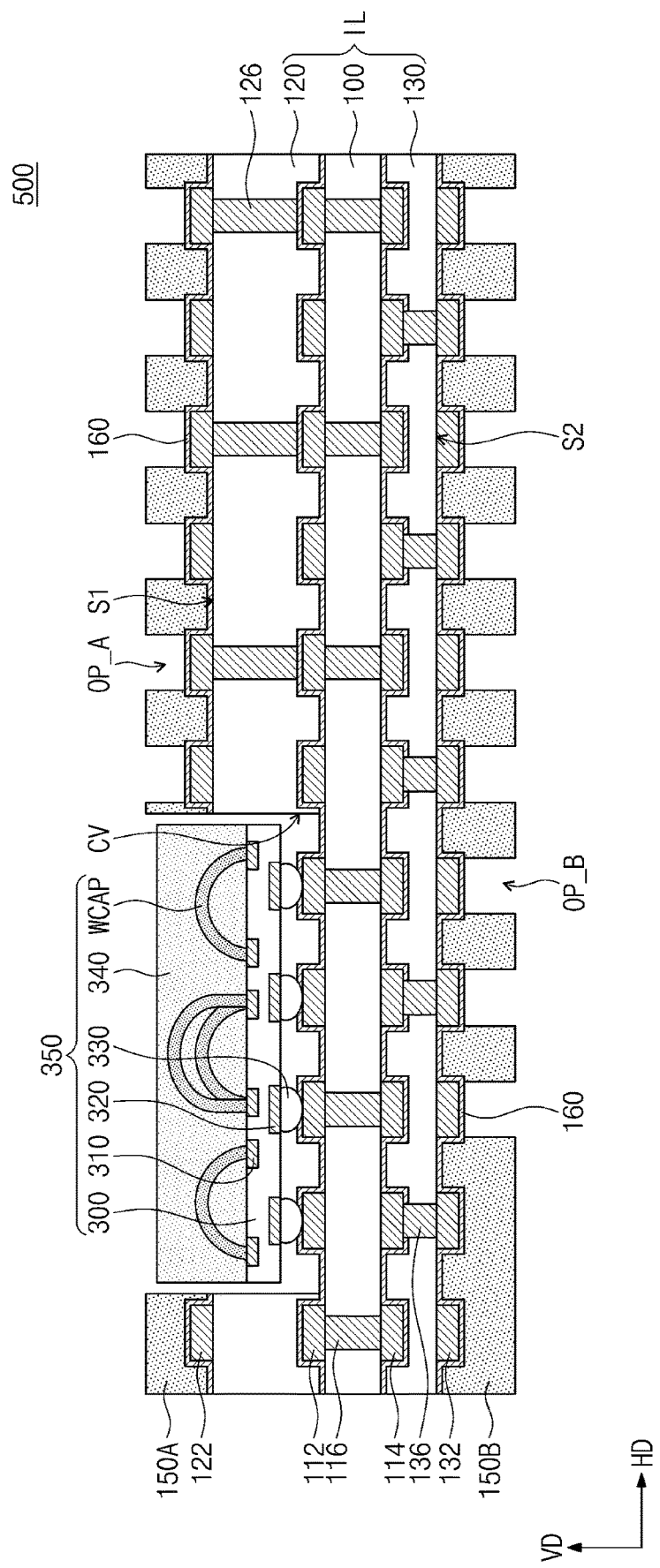
FIGS. 28A, 28B, and 29 are sectional views, each of which illustrates a wiring board according to an embodiment of the inventive concept.
Figure 28B:
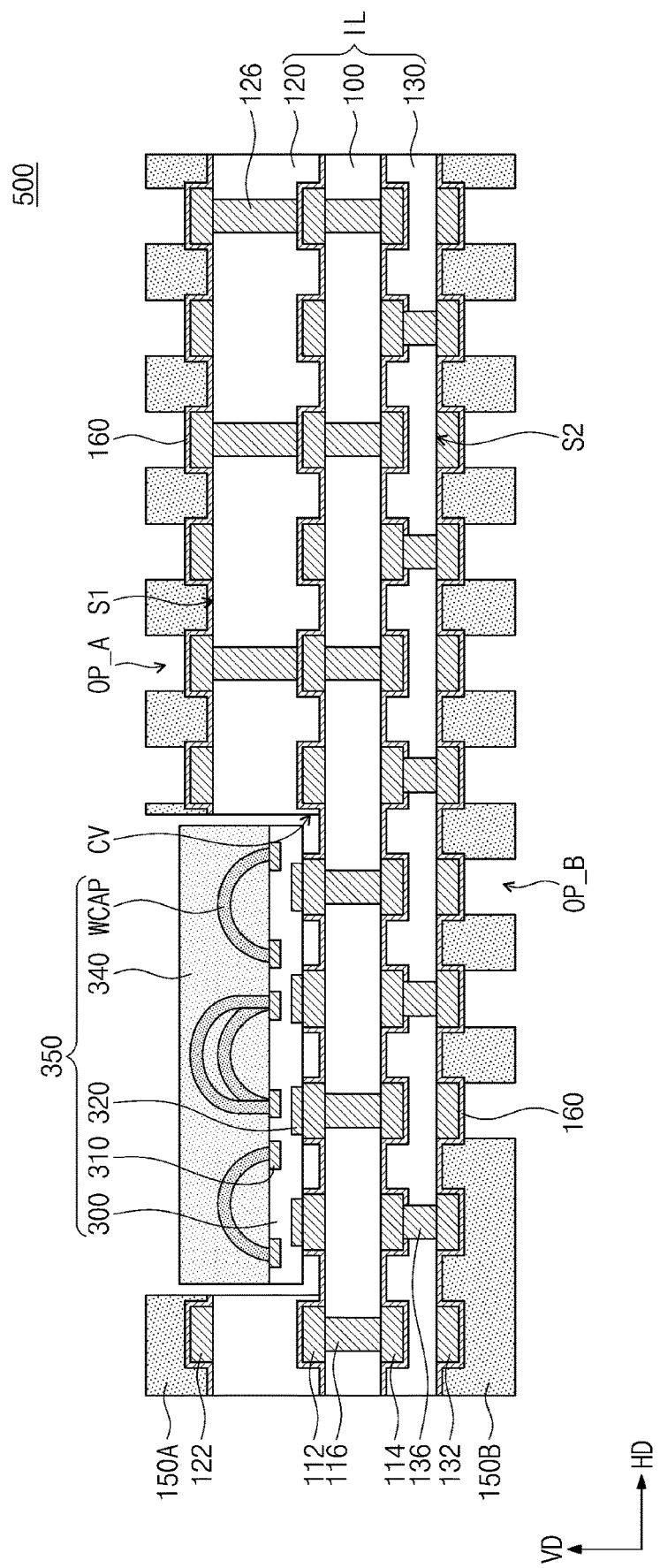

FIGS. 28A and 28B are sectional views illustrating a wiring board according to an embodiment of the inventive concept. For the sake of brevity, features, which are different from the wiring board described with reference to FIGS. 1 to 4, will be mainly described below.

Referring to FIGS. 28A and 28B, the wiring board 500 may include a capacitor chip 350, which is electrically connected to corresponding ones of the intermediate wiring patterns 112 and 114. The insulating layer IL may include a cavity CV, which is formed to penetrate the same, and the capacitor chip 350 may be disposed in the cavity CV. In an embodiment, the upper insulating layer 120 may include the cavity CV, which is formed to penetrate the same and to expose corresponding ones of the first intermediate wiring patterns 112 and the protection layer 160. The capacitor chip 350 may be disposed in the cavity CV of the upper insulating layer 120 and may be electrically connected to the corresponding first intermediate wiring patterns 112.

The capacitor chip 350 may include a substrate 300, a plurality of capacitor wires WCAP, which are mounted on a top surface of the substrate 300, and a chip mold layer 340, which is disposed on the top surface of the substrate 300 to cover the capacitor wires WCAP.

The substrate 300 may include first substrate pads 310 adjacent to the top surface of the substrate 300 and second substrate pads 320 adjacent to the bottom surface of the substrate 300, and the first substrate pads 310 may be electrically connected to the second substrate pads 320 through internal lines in the substrate 300. In an embodiment, the substrate 300 may be a printed circuit board.

The capacitor wires WCAP may be electrically connected to the first substrate pads 310. Each of the capacitor wires WCAP may be connected to corresponding ones of the first substrate pads 310 by a wire bonding method. Each of the capacitor wires WCAP may be substantially the same as the capacitor wire WCAP described with reference to FIGS. 2 to 4.

The chip mold layer 340 may seal the capacitor wires WCAP. The chip mold layer 340 may be formed of or include at least one of insulating materials (e.g., epoxy molding compounds).

In an embodiment, as shown in FIG. 28A, the capacitor chip 350 may further include connection terminals 330 provided on a bottom surface of the substrate 300. The connection terminals 330 may be electrically connected to the second substrate pads 320. The connection terminals 330 may be formed of or include at least one of pillars, bumps, or solder balls and may be formed of or include a conductive material. The connection terminals 330 of the capacitor chip 350 may be provided to penetrate the protection layer 160 and may be electrically connected to the corresponding first intermediate wiring patterns 112. In another embodiment, as shown in FIG. 28B, the second substrate pads 320 of the substrate 300 may be directly bonded to the corresponding first intermediate wiring patterns 112. As an example, the second substrate pads 320 of the substrate 300 may be directly bonded to the corresponding first intermediate wiring patterns 112 by a Cu-to-Cu bonding process. The wiring board 500 may further include an upper mask layer 150A, which is disposed on the first surface S1 of the insulating layer IL to cover the upper wiring patterns 122, and a lower mask layer 150B, which is disposed on the second surface S2 of the insulating layer IL to cover the lower wiring patterns 132. The upper mask layer 150A may include upper openings OP_A. The upper openings OP_A may be provided to expose corresponding ones of the upper wiring patterns 122 and the protection layer 160 on the corresponding upper wiring patterns 122. In an embodiment, the capacitor chip 350 may not be covered with the upper mask layer 150A and may be exposed. The lower mask layer 150B may include lower openings OP_B. The lower openings OP_B may expose corresponding ones of the lower wiring patterns 132 and the protection layer 160 on the corresponding lower wiring patterns 132. In an embodiment, the protection layer 160 may be omitted.

Except for the afore-described features, the wiring board 500 according to the present embodiments may be substantially the same as the wiring board 500 described with reference to FIGS. 1 to 4.

Figure 29:
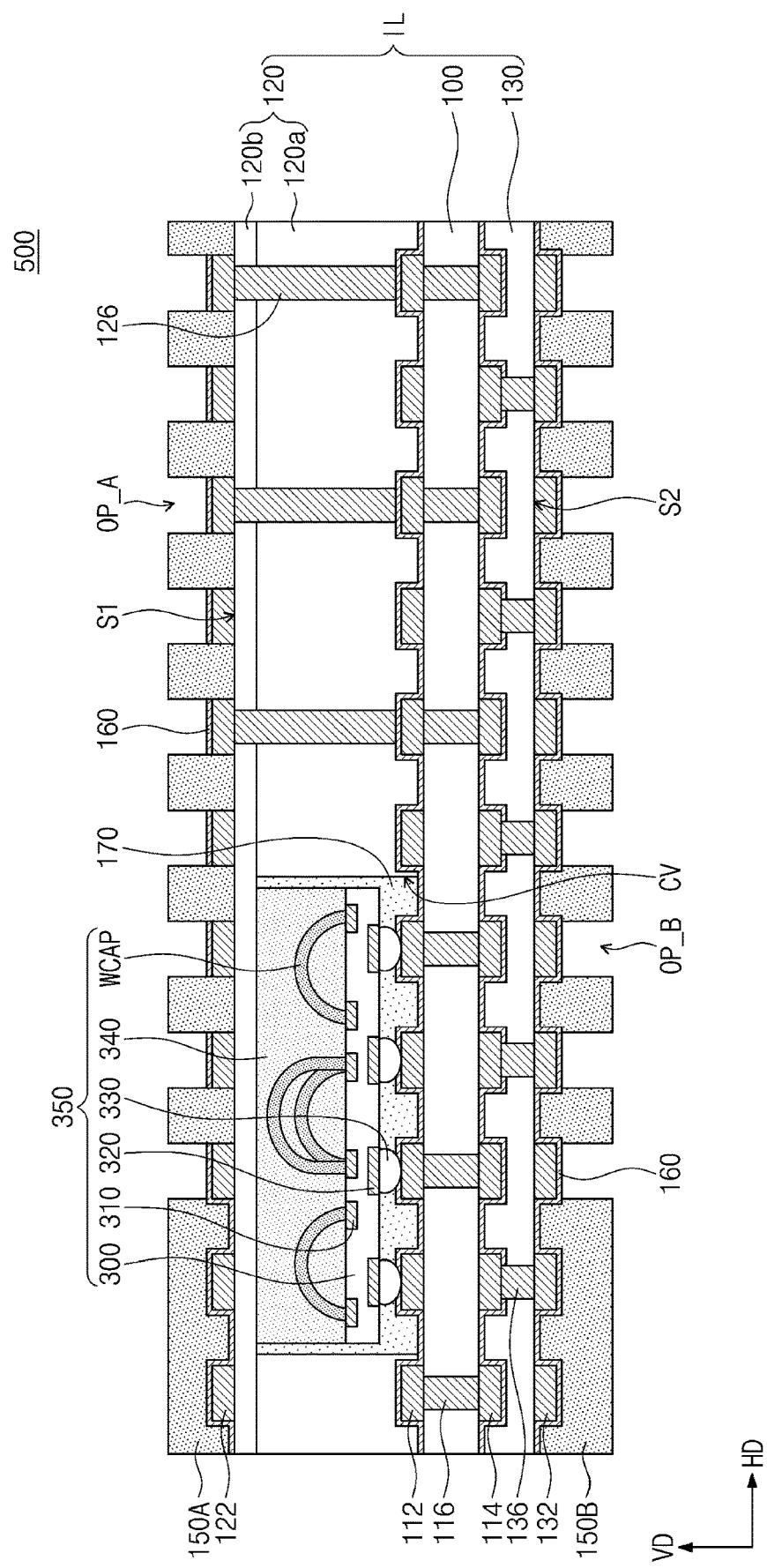

FIG. 29 is a sectional view illustrating a wiring board according to an embodiment of the inventive concept. For the sake of brevity, features, which are different from the wiring board described with reference to FIGS. 1 to 4, will be mainly described below.

Referring to FIG. 29, the wiring board 500 may include a capacitor chip 350 electrically connected to corresponding ones of the intermediate wiring patterns 112 and 114. The insulating layer IL may include a cavity CV, which is formed to penetrate the same, and the capacitor chip 350 may be disposed in the cavity CV. As an example, the upper insulating layer 120 may include a first upper insulating layer 120a and a second upper insulating layer 120b, which are sequentially stacked on the intermediate layer 100, and the first upper insulating layer 120a may include the cavity CV, which is formed to penetrate the same. The capacitor chip 350 may be disposed in the cavity CV of the first upper insulating layer 120a and may be connected to corresponding ones of the first intermediate wiring patterns 112. In an embodiment, the capacitor chip 350 may be disposed to have substantially the same features as the capacitor chip 350 described with reference to FIG. 28A. In an embodiment, unlike that illustrated in the drawings, the capacitor chip 350 may be disposed to have substantially the same features as the capacitor chip 350 described with reference to FIG. 28B.

The wiring board 500 may further include a mold layer 170, which is provided to fill the cavity CV and to cover the capacitor chip 350. The second upper insulating layer 120b may be disposed on the first upper insulating layer 120a and may be extended to a region on the capacitor chip 350 and the mold layer 170. The capacitor chip 350 may be covered with the second upper insulating layer 120b and may be embedded in the upper insulating layer 120.

The wiring board 500 may further include an upper mask layer 150A, which is disposed on the first surface S1 of the insulating layer IL to cover the upper wiring patterns 122, and a lower mask layer 150B, which is disposed on the second surface S2 of the insulating layer IL to cover the lower wiring patterns 132. The upper mask layer 150A may include upper openings OP_A. The upper openings OP_A may be provided to expose corresponding ones of the upper wiring patterns 122 and the protection layer 160 on the corresponding upper wiring patterns 122. The lower mask layer 150B may include lower openings OP_B. The lower openings OP_B may be provided to expose corresponding ones of the lower wiring patterns 132 and the protection layer 160 on the corresponding lower wiring patterns 132. In an embodiment, the protection layer 160 may be omitted.

Except for the afore-described features, the wiring board 500 according to the present embodiments may be substantially the same as the wiring board 500 described with reference to FIGS. 1 to 4.

Figure 30:
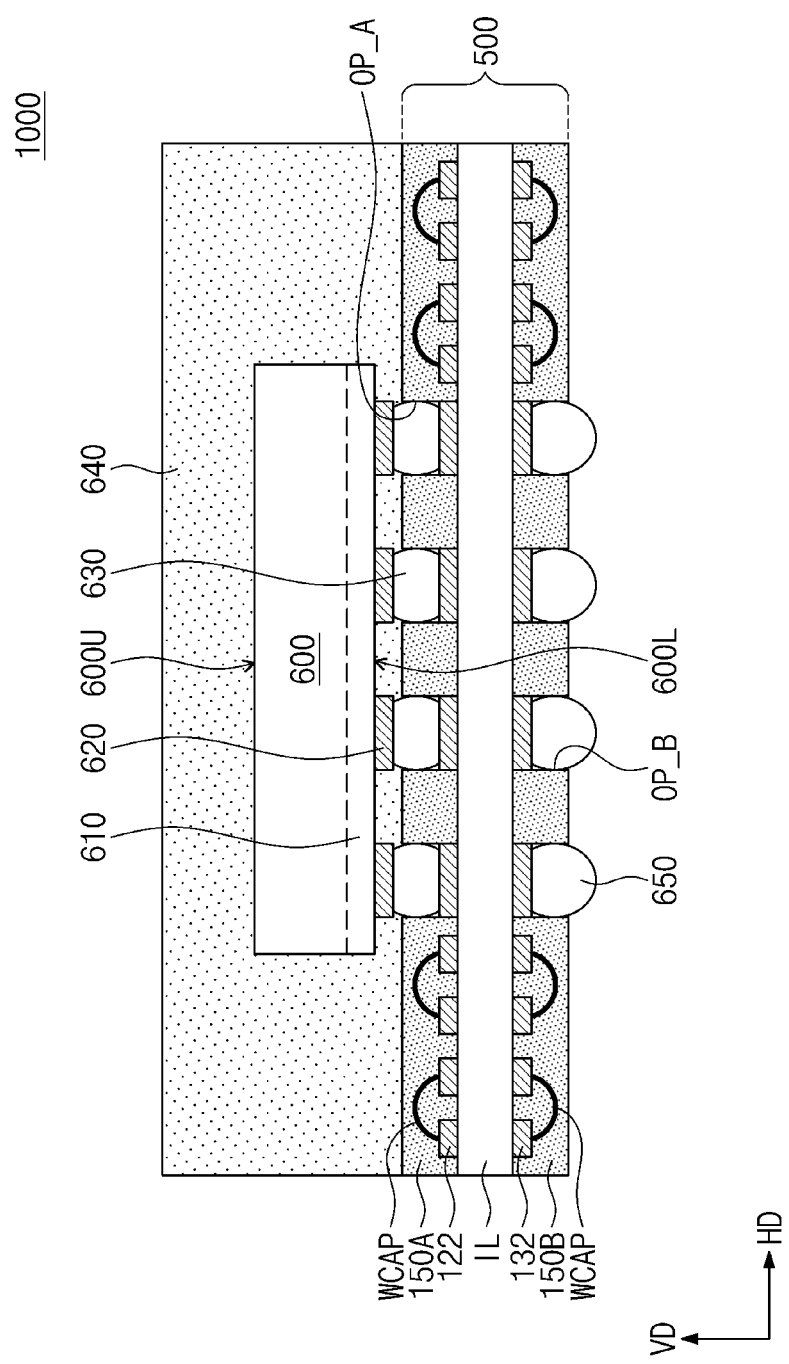
FIGS. 30 and 31 are sectional views illustrating semiconductor packages including a wiring board according to an embodiment of the inventive concept.
Figure 31:
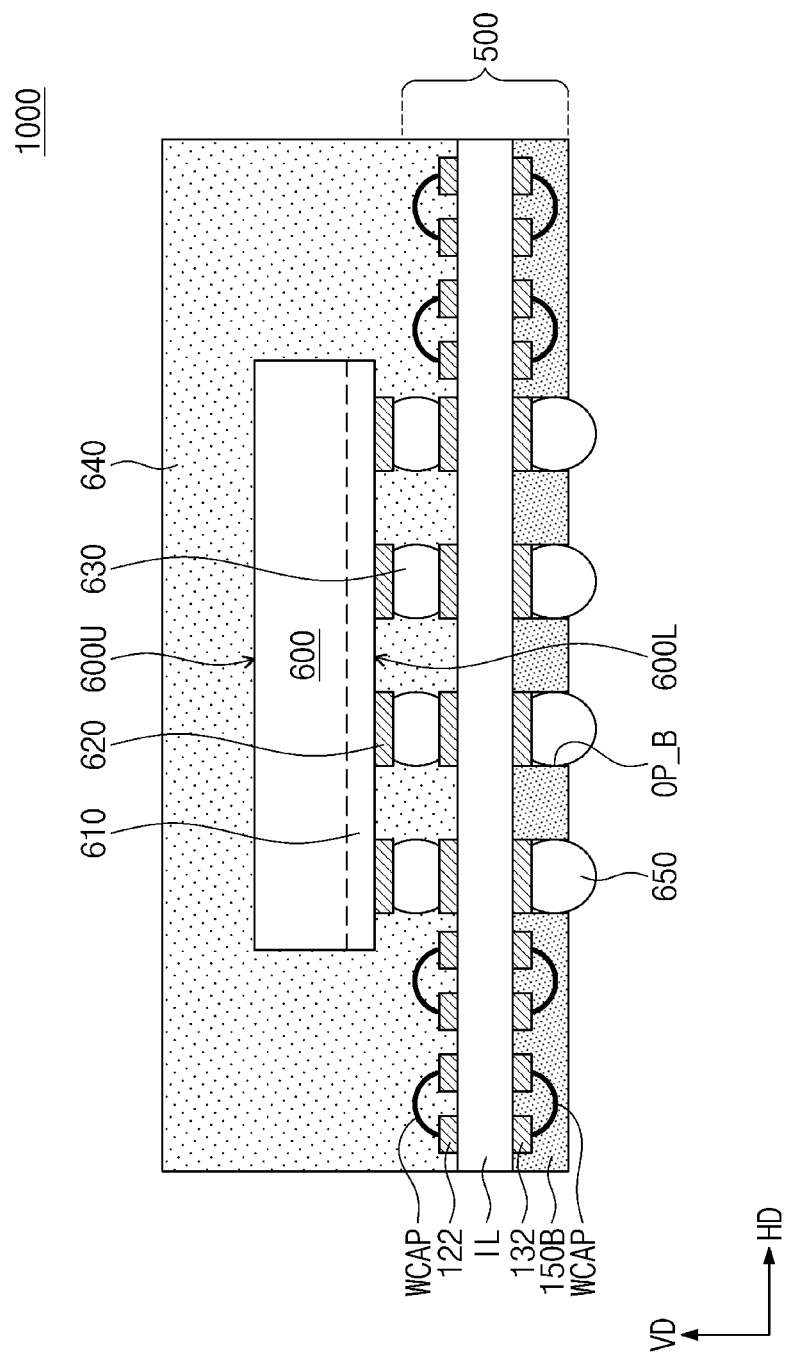

FIGS. 30 and 31 are sectional views illustrating semiconductor packages including a wiring board according to an embodiment of the inventive concept.

Referring to FIGS. 30 and 31, a semiconductor package 1000 may include a wiring board 500, a semiconductor chip 600 mounted on the wiring board 500, and an upper mold layer 640, which is disposed on the wiring board 500 to cover the semiconductor chip 600. The wiring board 500 may be configured to have substantially the same features as the wiring board 500 described with reference to FIGS. 1 to 29.

The semiconductor chip 600 may be a memory chip, a logic chip, an application processor (AP) chip, or a system-on-chip (SOC) and may have a top surface 600U and a bottom surface 600L, which are opposite to each other. The semiconductor chip 600 may include a circuit layer 610 adjacent to the bottom surface 600L of the semiconductor chip 600 and chip pads 620 disposed on the bottom surface 600L of the semiconductor chip 600. The chip pads 620 may be electrically connected to the circuit layer 610. Upper connection bumps 630 may be disposed on the chip pads 620, respectively, and may be electrically connected to the chip pads 620. The upper connection bumps 630 may be formed of or include at least one of pillars, bumps, or solder balls and may be formed of or include a conductive material.

In an embodiment, as shown in FIG. 30, the wiring board 500 may include the upper wiring patterns 122 and the upper mask layer 150A covering the upper wiring patterns 122. The upper mask layer 150A may include upper openings OP_A, which are formed to expose corresponding ones of the upper wiring patterns 122. The upper connection bumps 630 may be provided in the upper openings OP_A and may be electrically connected to the corresponding upper wiring patterns 122. The semiconductor chip 600 may be electrically connected to the wiring board 500 through the upper connection bumps 630 and the corresponding upper wiring patterns 122. The wiring board 500 may include the capacitor wire WCAP embedded therein. As an example, the capacitor wire WCAP may be embedded in the upper mask layer 150A and may be connected to corresponding ones of the upper wiring patterns 122 by a wire bonding method.

In another embodiment, as shown in FIG. 31, the wiring board 500 may not include the upper mask layer 150A. The upper connection bumps 630 may be electrically connected to corresponding ones of the upper wiring patterns 122. The semiconductor chip 600 may be electrically connected to the wiring board 500 through the upper connection bumps 630 and the corresponding upper wiring patterns 122. The wiring board 500 may include the capacitor wire WCAP, which are connected to corresponding ones of the upper wiring patterns 122. The capacitor wire WCAP may be connected to the corresponding upper wiring patterns 122 by a wire bonding method. The capacitor wire WCAP may be covered with the upper mold layer 640 and may be disposed in the upper mold layer 640.

Referring back to FIGS. 30 and 31, the wiring board 500 may include the lower wiring patterns 132 and the lower mask layer 150B covering the lower wiring patterns 132. The lower mask layer 150B may include lower openings OP_B, which are formed to expose corresponding ones of the lower wiring patterns 132. Lower connection bumps 650 may be disposed in the lower openings OP_B and may be electrically connected to the corresponding lower wiring patterns 132. The lower connection bumps 650 may be formed of or include at least one of pillars, bumps, or solder balls and may be formed of or include a conductive material. The lower connection bumps 650 may be connected to outer terminals.

The wiring board 500 may include the capacitor wire WCAP embedded therein. As an example, the capacitor wire WCAP may be embedded in the lower mask layer 150B and may be connected to corresponding ones of the lower wiring patterns 132 by a wire bonding method.

The upper mold layer 640 may be disposed on the wiring board 500 to seal the semiconductor chip 600. The upper mold layer 640 may be formed of or include at least one of insulating materials (e.g., epoxy molding compounds).

According to an embodiment of the inventive concept, an embedded-type wiring board, in which a capacitor wire is embedded, may be provided. The capacitor wire may have a wire shape and may be connected to corresponding wiring patterns, which are provided in the wiring board, by a wire bonding method. Since the capacitor wire has the wire shape, it may be possible to easily reduce a size of the capacitor wire. In addition, since the capacitor wire is connected to the corresponding wiring patterns by the wire bonding method, the capacitor wire may be easily mounted in the wiring board. Accordingly, it may be possible to easily increase an integration density of the capacitor wires, which are embedded in the wiring board. As a result, it may be possible not only to easily reduce a size and thickness of the wiring board but also to improve performance and reliability characteristics of the wiring board.

While example embodiments of the inventive concept have been particularly shown and described, it will be understood by one of ordinary skill in the art that variations in form and detail may be made therein without departing from the spirit and scope of the attached claims.

What is claimed is:

1. A wiring board, comprising:
an insulating layer having a first surface and a second surface, which are opposite to each other;

upper wiring patterns on the first surface of the insulating layer;

lower wiring patterns on the second surface of the insulating layer;

intermediate wiring patterns, which are disposed in the insulating layer and are electrically connected to the upper wiring patterns and the lower wiring patterns; and a capacitor wire connected to corresponding wiring patterns of the upper wiring patterns, the lower wiring patterns, and the intermediate wiring patterns, wherein the capacitor wire comprises:

a core electrode line having a wire shape;

an outer electrode line covering at least a portion of the core electrode line; and a dielectric line interposed between the core electrode line and the outer electrode line, wherein the outer electrode line comprises a material whose melting point is lower than a melting point of the core electrode line.

2. The wiring board of claim 1, wherein the core electrode line comprises a first metal, and the outer electrode line comprises a second metal different from the first metal.

3. The wiring board of claim 1, wherein the capacitor wire has a first end portion and a second end portion, which are opposite to each other in a longitudinal direction of the core electrode line, and at the first end portion of the capacitor wire, the core electrode line is connected to a first one of the corresponding wiring patterns by a wire bonding method, and at the second end portion of the capacitor wire, the outer electrode line is connected to a second one of the corresponding wiring patterns by the wire bonding method.

4. The wiring board of claim 1, wherein the capacitor wire has a first end portion and a second end portion, which are opposite to each other in a longitudinal direction of the core electrode line, and at the first end portion of the capacitor wire, the core electrode line is connected to one of the corresponding wiring patterns by a ball bonding method or a wedge bonding method.

5. The wiring board of claim 4, wherein, at the second end portion of the capacitor wire, the outer electrode line is connected to another of the corresponding wiring patterns by a wedge bonding method.

6. The wiring board of claim 1, further comprising a lower mask layer, which is disposed on the second surface of the insulating layer to cover the lower wiring patterns, wherein the capacitor wire is connected to corresponding ones of the lower wiring patterns and is disposed in the lower mask layer.

7. The wiring board of claim 1, further comprising an upper mask layer, which is disposed on the first surface of the insulating layer to cover the upper wiring patterns, wherein the capacitor wire is connected to corresponding ones of the upper wiring patterns and is disposed in the upper mask layer.

8. The wiring board of claim 1, wherein the capacitor wire is connected to corresponding ones of the intermediate wiring patterns and is disposed in the insulating layer.

9. The wiring board of claim 1, wherein the insulating layer includes a cavity, and the capacitor wire is disposed in the cavity.

10. The wiring board of claim 9, further comprising a mold layer, which is provided to fill the cavity and to cover the capacitor wire.

11. The wiring board of claim 1, wherein the insulating layer comprises an upper insulating layer adjacent to the first surface, and the upper wiring patterns are embedded in the upper insulating layer.

12. The wiring board of claim 1, wherein the insulating layer has a side surface between the first surface and the second surface, and the capacitor wire is connected to the corresponding wiring patterns, on the side surface of the insulating layer.

13. The wiring board of claim 1, further comprising a pillar structure disposed on the first surface of the insulating layer, wherein the capacitor wire has a first end portion and a second end portion, which are opposite to each other in a longitudinal direction of the core electrode line, the capacitor wire is wound around the pillar structure, and the first end portion of the capacitor wire is connected to one of the upper wiring patterns.

14. The wiring board of claim 13, wherein the second end portion of the capacitor wire is connected to another of the upper wiring patterns.

15. The wiring board of claim 13, wherein the pillar structure is a conductive pillar, and the second end portion of the capacitor wire is electrically connected to the pillar structure.

16. A wiring board, comprising:

an insulating layer having a first surface and a second surface, which are opposite to each other;

upper wiring patterns on the first surface of the insulating layer;

lower wiring patterns on the second surface of the insulating layer;

intermediate wiring patterns, which are disposed in the insulating layer and are electrically connected to the upper wiring patterns and the lower wiring patterns; and a capacitor wire connected to corresponding wiring patterns of the upper wiring patterns, the lower wiring patterns, and the intermediate wiring patterns, wherein the capacitor wire comprises:

a core electrode line, which has a wire shape and is extended in a longitudinal direction;

a dielectric line, which is provided to enclose an outer circumference surface of the core electrode line and is extended in the longitudinal direction; and an outer electrode line, which is provided to enclose an outer circumference surface of the dielectric line and is extended in the longitudinal direction, and the capacitor wire is connected to the corresponding wiring patterns by a wire bonding method.

17. The wiring board of claim 16, wherein the capacitor wire has a first end portion and a second end portion, which are opposite to each other in the longitudinal direction, and at the first end portion of the capacitor wire, an end portion of the core electrode line is connected to one of the corresponding wiring patterns by a ball bonding method or a wedge bonding method.

18. The wiring board of claim 17, wherein, at the second end portion of the capacitor wire, an end portion of the outer electrode line is connected to another of the corresponding wiring patterns by a wedge bonding method.

19. The wiring board of claim 16, further comprising at least one of an upper mask layer, which is disposed on the first surface of the insulating layer to cover the upper wiring patterns, and a lower mask layer, which is disposed on the second surface of the insulating layer to cover the lower wiring patterns, wherein the capacitor wire is disposed in at least one of the upper mask layer, the lower mask layer, and the insulating layer.

20. A wiring board, comprising:

an insulating layer having a first surface and a second surface, which are opposite to each other;

upper wiring patterns on the first surface of the insulating layer;

lower wiring patterns on the second surface of the insulating layer;

intermediate wiring patterns, which are disposed in the insulating layer and are electrically connected to the upper wiring patterns and the lower wiring patterns; and a capacitor wire connected to corresponding wiring patterns of the upper wiring patterns, the lower wiring patterns, and the intermediate wiring patterns, wherein the capacitor wire comprises:

a core electrode line having a wire shape;

an outer electrode line covering at least a portion of the core electrode line; and a dielectric line interposed between the core electrode line and the outer electrode line, wherein the core electrode line comprises a first metal, and wherein the outer electrode line comprises a second metal different from the first metal.

* * * * *